(12) United States Patent
Fujimoto et al.

(10) Patent No.: US 8,999,749 B2
(45) Date of Patent: Apr. 7, 2015

(54) METHOD FOR MANUFACTURING ORGANIC SEMICONDUCTOR ELEMENT, AND ORGANIC SEMICONDUCTOR ELEMENT

(75) Inventors: Shin-ya Fujimoto, Tokyo-to (JP); Ken Tomino, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 50 days.

(21) Appl. No.: 14/110,643

(22) PCT Filed: Apr. 11, 2012

(86) PCT No.: PCT/JP2012/059928
§ 371 (c)(1),
(2), (4) Date: Oct. 8, 2013

(87) PCT Pub. No.: WO2012/141224
PCT Pub. Date: Oct. 18, 2012

(65) Prior Publication Data
US 2014/0027752 A1    Jan. 30, 2014

(30) Foreign Application Priority Data

Apr. 11, 2011 (JP) ................................. 2011-087642

(51) Int. Cl.
| H01L 51/40 | (2006.01) |
| H01L 51/00 | (2006.01) |
| H01L 51/10 | (2006.01) |
| H01L 51/05 | (2006.01) |

(52) U.S. Cl.
CPC ........ *H01L 51/0001* (2013.01); *H01L 51/0017* (2013.01); *H01L 51/0541* (2013.01); *H01L 51/0545* (2013.01); *H01L 51/0566* (2013.01); *H01L 51/107* (2013.01); *H01L 51/0512* (2013.01); *H01L 51/0024* (2013.01); *H01L 51/0529* (2013.01)

(58) Field of Classification Search
None
See application file for complete search history.

(56) References Cited

U.S. PATENT DOCUMENTS

2007/0040165 A1*  2/2007  Dimmler et al. ............... 257/40
2009/0065770 A1*  3/2009  Miura et al. .................... 257/40

FOREIGN PATENT DOCUMENTS

| JP | 2005-277238 A | 10/2005 |
| JP | 2005-334864 A | 12/2005 |

(Continued)

OTHER PUBLICATIONS

International Search Report mailed Jun. 19, 2012; PCT/JP2012/059928.

*Primary Examiner* — Allen Parker
(74) *Attorney, Agent, or Firm* — Ladas & Parry LLP

(57) ABSTRACT

A method for manufacturing an organic semiconductor element capable of obtaining an organic semiconductor element in which an organic semiconductor layer is patterned without lowering the mobility of the organic semiconductor layer through a simple and easy process, which includes: an organic semiconductor layer formation step; a first dielectric layer formation step of forming a first dielectric layer on the organic semiconductor layer to be positioned at least on a channel region between the source electrode and the drain electrode; and a second dielectric layer formation step, wherein the second dielectric layer has a contact portion contacting the organic semiconductor layer around the first dielectric layer, and a mixed layer in which the organic semiconductor layer and the second dielectric layer are mixed with each other is formed to constitute an interface between the organic semiconductor layer and the second dielectric layer in the contact portion.

8 Claims, 12 Drawing Sheets

(56) References Cited

FOREIGN PATENT DOCUMENTS

| | | |
|---|---|---|
| JP | 2006-100808 A | 4/2006 |
| JP | 2008-270494 A | 11/2008 |
| JP | 2008-277381 A | 11/2008 |
| JP | 2010-283332 A | 12/2010 |
| WO | 2006/048092 A1 | 5/2006 |
| WO | 2008/131836 A1 | 11/2008 |

* cited by examiner

METHOD FOR MANUFACTURING ORGANIC SEMICONDUCTOR ELEMENT, AND ORGANIC SEMICONDUCTOR ELEMENT

TECHNICAL FIELD

The present invention relates to an organic semiconductor element in which an organic transistor is formed on a substrate, and a method for manufacturing the element.

BACKGROUND ART

In recent years, about semiconductor transistors, typical example of which are TFTs, the scope of articles to which the transistors are used tends to be enlarged with the development of display devices. In such a semiconductor transistor, its electrodes are connected to each other through the material of its semiconductor, so that the transistor fulfills a function as a switching element.

Hitherto, the semiconductor material used in the semiconductor transistor has been an inorganic semiconductor material such as silicon (Si), gallium arsenic (GaAs), or indium gallium arsenic (InGaAs). In recent years, semiconductor transistors in which such an inorganic material is used have been used in TFT array substrates for display, the use of which has been spreading in liquid crystal display devices.

As the semiconductor material, an organic semiconductor material made of an organic compound has also been known. The organic semiconductor material is low in process temperature, so that the material can be formed on a flexible plastic substrate. Thus, the material has advantages that the material is stable against mechanical impacts, and can be made light. Moreover, the material can be produced through a coating process such as printing, so that the material may be mass-produced into a larger area at lower costs than the inorganic semiconductor material. Accordingly, the following activities in which such organic semiconductor materials are objects have been actively made: applications of the organic semiconductor materials to next-generation display devices, such as flexible disks, typical examples of which are electronic papers; and researches in which print RFID tags are targeted.

At the time of manufacturing an organic transistor in which an organic semiconductor material is used, it is usually necessary to pattern its organic semiconductor layer. As a method for patterning the organic semiconductor layer, an ink-jetting method and others have been reported. However, the methods require the step of forming a hydrophilic/hydrophobic pattern on a substrate, the step of forming partition walls thereon, or some other step. However, the organic semiconductor material, in particular, of a low-molecular-weight type has a problem that when the organic semiconductor layer undergoes such a step, the material is declined in mobility.

Separately, attempts have been made for forming an organic semiconductor layer on the whole of a surface and then forming a protective layer thereon, and further inactivating its portion not protected by the protective layer as a mask, or removing the organic semiconductor layer partially (see, for example, Patent Literatures 1 to 4). As a method for the inactivation, investigations have been made about plasma treatment, the use of an oxidizer, and others. As a method for the removal, investigations have been made about laser radiation, and others.

However, when an organic semiconductor element is manufactured, these methods require the step of patterning its organic semiconductor layer by inactivating or removing the organic semiconductor layer, and further usually requires the step of forming a passivation layer separately. Thus, the process thereof becomes complicated, and costs are increased.

CITATION LIST

Patent Literatures

Patent Literature 1: WO 2006/048092 pamphlet
Patent Literature 2: WO 2008/131836 pamphlet
Patent Literature 3: Japanese Patent Application Laid-Open (JP-A) No. 2008-277381
Patent Literature 4: JP-A No. 2008-270494

SUMMARY OF INVENTION

Technical Problem

In light of the above-mentioned actual circumstances, the present invention has been made, and a main object thereof is to provide a method for manufacturing an organic semiconductor element capable of obtaining an organic semiconductor element in which an organic semiconductor layer is patterned without lowering the mobility of the organic semiconductor layer through a simple and easy process.

Solution to Problem

In order to attain the object, the present invention provides a method for manufacturing an organic semiconductor element, comprising steps of: an organic semiconductor layer formation step of forming an organic semiconductor layer to cover a source electrode and a drain electrode; a first dielectric layer formation step of forming a first dielectric layer on the organic semiconductor layer to be positioned at least on a channel region between the source electrode and the drain electrode; and a second dielectric layer formation step of forming a second dielectric layer on the organic semiconductor layer to cover the first dielectric layer, wherein the second dielectric layer has a contact portion contacting the organic semiconductor layer around the first dielectric layer, and a mixed layer in which the organic semiconductor layer and the second dielectric layer are mixed with each other is formed in an interface between the organic semiconductor layer and the second dielectric layer in the contact portion.

According to the invention, the mixed layer is formed in the interface between the organic semiconductor layer and the second dielectric layer, so that the organic semiconductor layer of the region where the mixed layer is formed is lowered in conductivity while the organic semiconductor layer of the region protected by the first dielectric layer, where the mixed layer is not formed, keeps conductivity. It is therefore possible to pattern the organic semiconductor layer without lowering the mobility of the organic semiconductor layer. It is also possible to attain simultaneously the formation of the second dielectric layer, which corresponds to a passivation layer, and the patterning of the organic semiconductor layer. Thus, the organic semiconductor element manufacturing process can be made simple and easy.

In the invention, a second-dielectric-layer-forming coating liquid may be coated to form the second dielectric layer in the second dielectric layer formation step.

In the invention, a second-dielectric-layer-forming resin may be bonded under pressure to form the second dielectric layer in the second dielectric layer formation step.

The invention also provides a method for manufacturing an organic semiconductor element, comprising an organic semiconductor layer formation step of forming an organic semiconductor layer to cover a source electrode and a drain electrode; and a first dielectric layer and second dielectric layer formation step of using a dielectric layer laminated body in which a first dielectric layer is formed on a second-dielectric-layer-forming resin, and bonding the dielectric layer laminated body under pressure to arrange the first dielectric layer on the organic semiconductor layer to be positioned at least on a channel region between the source electrode and the drain electrode, thereby forming a second dielectric layer on the organic semiconductor layer to cover the first dielectric layer, wherein the second dielectric layer has a contact portion contacting the organic semiconductor layer around the first dielectric layer, and a mixed layer in which the organic semiconductor layer and the second dielectric layer are mixed with each other is formed in an interface between the organic semiconductor layer and the second dielectric layer in the contact portion.

According to the invention, the mixed layer is formed in the interface between the organic semiconductor layer and the second dielectric layer, so that the organic semiconductor layer of the region where the mixed layer is formed is lowered in conductivity while the organic semiconductor layer of the region protected by the first dielectric layer, where the mixed layer is not formed, keeps conductivity. It is therefore possible to pattern the organic semiconductor layer without lowering the mobility of the organic semiconductor layer. It is also possible to attain simultaneously the formation of the second dielectric layer, which corresponds to a passivation layer, and the patterning of the organic semiconductor layer. Thus, the organic semiconductor element manufacturing process can be made simple and easy.

The invention may have, before the organic semiconductor layer formation step, a source electrode and drain electrode formation step of using an electrode laminated body having a substrate, a gate electrode formed on the substrate, and a gate insulating layer formed on the substrate to cover the gate electrode, and forming the source electrode and the drain electrode on the gate insulating layer of the electrode laminated body. When the invention has this source electrode and drain electrode formation step, an organic semiconductor element of a bottom-gate/bottom-contact type can be formed.

The invention also provides an organic semiconductor element comprising: a source electrode and a drain electrode; an organic semiconductor layer formed to cover the source electrode and the drain electrode; a first dielectric layer formed on the organic semiconductor layer to be positioned at least on a channel region between the source electrode and the drain electrode; and a second dielectric layer formed on the organic semiconductor layer to cover the first dielectric layer, wherein the second dielectric layer has a contact portion contacting the organic semiconductor layer around the first dielectric layer, and a mixed layer in which the organic semiconductor layer and the second dielectric layer are mixed with each other is formed in an interface between the organic semiconductor layer and the second dielectric layer in the contact portion.

According to the invention, the mixed layer is formed in the interface between the organic semiconductor layer and the second dielectric layer, so that the organic semiconductor layer of the region where the mixed layer is formed is lowered in conductivity while the organic semiconductor layer of the region protected by the first dielectric layer, where the mixed layer is not formed, keeps conductivity. Thus, the organic semiconductor element can be rendered an organic semiconductor element in which its organic semiconductor layer is patterned without lowering the mobility of the organic semiconductor layer.

In the invention, it is allowable that the organic semiconductor element comprises an electrode laminated body having a substrate, a gate electrode formed on the substrate, and a gate insulating layer formed on the substrate to cover the gate electrode, wherein the source electrode and the drain electrode are formed on the gate insulating layer of the electrode laminated body. When the organic semiconductor element of the invention has this structure, the element can be rendered an organic semiconductor element of a bottom-gate/bottom-contact type.

Advantageous Effects of Invention

The invention produces advantageous effects that an organic semiconductor element in which an organic semiconductor layer is patterned can be obtained without lowering the mobility of the organic semiconductor layer through a simple and easy process.

DESCRIPTION OF EMBODIMENTS

Hereinafter, a detailed description will be made about the method of the invention for manufacturing an organic semiconductor element, and the organic semiconductor element thereof.

A. Method for Manufacturing an Organic Semiconductor Element

First, the method of the invention for manufacturing an organic semiconductor element is described. The method for manufacturing an organic semiconductor element of the invention can be roughly classified into two embodiments. Hereinafter, the method for manufacturing an organic semiconductor element will be divided into the two embodiments, and each of the embodiments will be described.

1. First Embodiment

First, a description is made about the method for manufacturing an organic semiconductor element of the first embodiment of the invention. The method for manufacturing an organic semiconductor element of the embodiment comprises steps of: an organic semiconductor layer formation step of forming an organic semiconductor layer to cover a source electrode and a drain electrode; a first dielectric layer formation step of forming a first dielectric layer on the organic semiconductor layer to be positioned at least on a channel region between the source electrode and the drain electrode; and a second dielectric layer formation step of forming a second dielectric layer on the organic semiconductor layer to cover the first dielectric layer, wherein the second dielectric layer has a contact portion contacting the organic semiconductor layer around the first dielectric layer, and a mixed layer in which the organic semiconductor layer and the second dielectric layer are mixed with each other is formed in an interface between the organic semiconductor layer and the second dielectric layer in the contact portion.

Figure 1A:
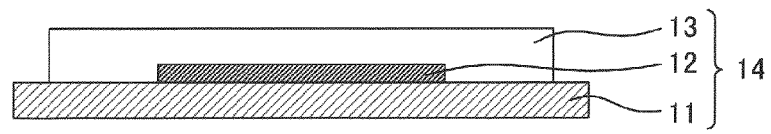
FIGS. 1A to 1E are a process chart illustrating an example of the method for manufacturing an organic semiconductor element of a first embodiment of the invention.
Figure 1B:
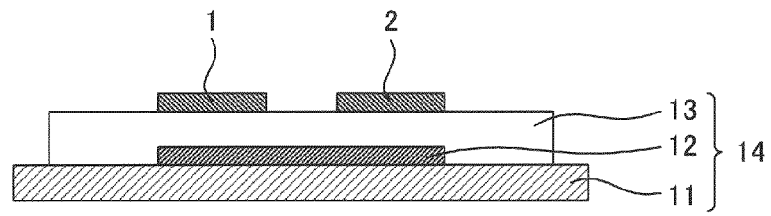
Figure 1C:
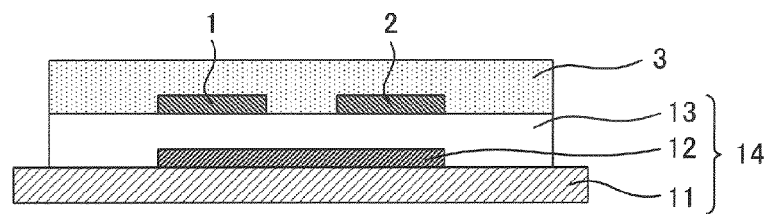
Figure 1D:
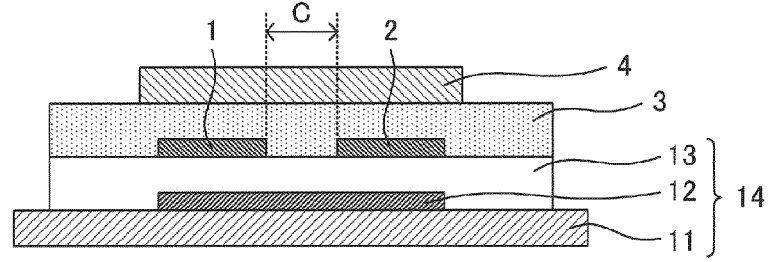
Figure 1E:
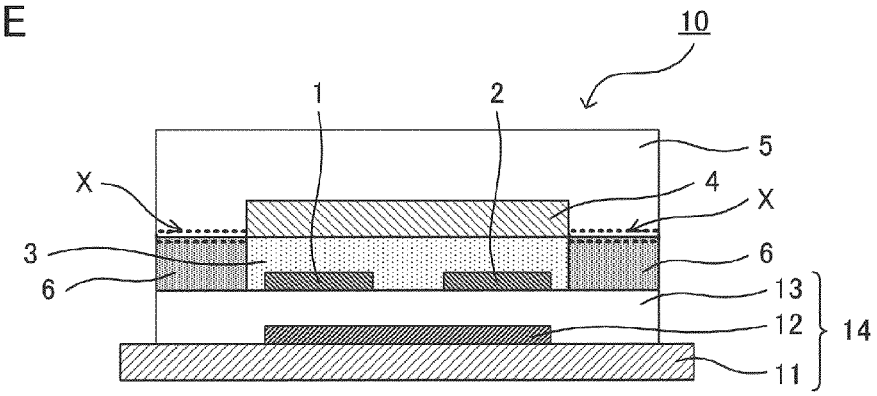

With reference to some of the drawings, the method for manufacturing an organic semiconductor element of the embodiment as referred to just above is described. FIGS. 1A to 1E are a process chart illustrating an example of the method for manufacturing an organic semiconductor element of the first embodiment of the invention. As illustrated in FIGS. 1A to 1E, in the method for manufacturing an organic semiconductor element of the embodiment, an electrode laminated body 14 is used, and the electrode laminated body 14 has a substrate 11, a gate electrode 12 formed on the substrate 11, and a gate insulating layer 13 formed on the substrate 11 to cover the gate electrode 12 (FIG. 1A). The method further comprises a source electrode and drain electrode formation step (FIG. 1B) of forming a source electrode 1 and a drain electrode 2 on the gate insulating layer 13 of the electrode laminated body 14; an organic semiconductor layer formation step (FIG. 1C) of forming an organic semiconductor layer 3 to cover the source electrode 1 and the drain electrode 2; a first dielectric layer formation step (FIG. 1D) of forming a first dielectric layer 4 on the organic semiconductor layer 3 to be positioned at least on a channel region C between the source electrode 1 and the drain electrode 2; and a second dielectric layer formation step (FIG. 1E) of forming a second dielectric layer 5 on the organic semiconductor layer 3 to cover the first dielectric layer 4. In this way, an organic semiconductor element 10 is manufactured (FIG. 1E). As illustrated in FIG. 1E, in the method for manufacturing an organic semiconductor element of the present embodiment, additionally, the second dielectric layer 5 has a contact portion X contacting the organic semiconductor layer 3 around the first dielectric layer 4, and a mixed layer 6 in which the organic semiconductor layer 3 and the second dielectric layer 5 are mixed with each other is formed in an interface between the organic semiconductor layer 3 and the second dielectric layer 5 in the contact portion X.

According to the embodiment, the mixed layer is formed in the interface between the organic semiconductor layer and the second dielectric layer, so that the organic semiconductor layer of the region where the mixed layer is formed is lowered in conductivity while the organic semiconductor layer of the region protected by the first dielectric layer, where the mixed layer is not formed, keeps conductivity. It is therefore possible to pattern the organic semiconductor layer without lowering the mobility of the organic semiconductor layer. It is also possible to attain simultaneously the formation of the second dielectric layer, which corresponds to a passivation layer, and the patterning of the organic semiconductor layer. Thus, the organic semiconductor element manufacturing process can be made simple and easy.

The method for manufacturing an organic semiconductor element of the embodiment has at least the organic semiconductor layer formation step, the first dielectric layer formation step, and the second dielectric layer formation step, and may, if necessary, have one or more optional different steps.

Hereinafter, a description will be made about each of the steps in the method for manufacturing an organic semiconductor element of the embodiment.

(1) Organic Semiconductor Layer Formation Step

First, the organic semiconductor layer formation step in the embodiment will be described. This step is a step of forming an organic semiconductor layer to cover a source electrode and a drain electrode.

The organic semiconductor layer formed in the step is usually a layer comprising an organic semiconductor material. The organic semiconductor material used in the step is not particularly limited as far as the material is a material capable of forming an organic semiconductor layer having a desired semiconductor property in accordance with a use purpose of the organic semiconductor element manufactured by the method for manufacturing an organic semiconductor element of the embodiment, and other factors. The material may be an organic semiconductor material usable generally in an organic semiconductor transistor. Examples of the organic semiconductor material include π electron conjugated aromatic compounds, chain compounds, organic pigments, and organic silicon compounds. More specific examples thereof include pentacene, pentancene derivatives, a typical example of which is silylethyne-substituted pentacene, anthradithiophene derivatives, benzothienobenzothiophene derivatives, dinapthothienothiophene derivatives, and other lowmolecular-weight organic semiconductor materials; and polypyrroles such as polypyrrole, poly (N-substituted pyrrole), poly(3-substituted pyrrole) and poly(3,4-disubstituted pyrrole), polythiophenes such as polythiophene, poly(3-substituted thiophene), poly(3,4-disubstituted thiophene) and polybenzothiophene, polyisothianaphthenes such as polyisothianaphthene, polythienylenevinylenes such as polythienylenevinylene, poly(p-phenylenevinylene) polymers such as poly(p-phenylenevinylene), polyanilines such as polyaniline and poly(N-substituted aniline), polyacetylenes such as polyacetylene, polydiacetylene, polyazulenes such as polyazulene, and other polymeric organic semiconductor materials. In the embodiment, it is particularly preferred to use any one of the low-molecular-weight semiconductor materials. This is because the material easily forms the mixed layer in which the organic semiconductor layer and the second dielectric layer are mixed with each other.

The organic semiconductor material used in the present step may be a liquid crystal organic semiconductor material. The liquid crystal organic semiconductor material used in the step is not particularly limited as far as the material is a material having semiconductor properties, and exhibiting a liquid crystal phase at predetermined temperatures. The material may be classified into a polymeric liquid crystal organic semiconductor material, and a low-molecular-weight liquid crystal organic semiconductor material.

Examples of the polymeric liquid crystal organic semiconductor material include polythiophene derivatives, polyphenylene derivatives, polyaniline derivatives, polyphenylene vinylene derivatives, polythienylenevinylene derivatives, polyacetylene derivatives, polydiacetylene derivatives, polytriphenylamine derivatives, copolymer derivatives made from triphenylamine and phenylenevinylene, copolymer derivatives made from thiophene and phenylene, copolymer derivatives made from thiophene and thienothiophene, and copolymer derivatives made from thiophene and fluorene.

Examples of the low-molecular-weight liquid crystal organic semiconductor material include oligochalcogenophene derivatives, oligophenylene derivatives, cooligomer derivatives each made from chalcogenophene and phenylene, condensed cyclic compound derivatives of chalcogenophene, such as tetrathienoacene, condensed cyclic compound derivatives each made from chalcogenophene and phenylene, condensed polycyclic hydrocarbon derivatives such as anthracene, tetracene, pentacene, pyrene, triphenylene and coronene, cooligomer derivatives each made from chalcogenophene and a condensed polycyclic hydrocarbon, phthalocyanine derivatives, porphyrin derivatives, tetrathiofulvalene derivatives, triphenylamine derivatives, tetracyanoquinodimethane derivatives, benzoquinone derivatives, thiazolothiazole derivatives, and fullerene derivatives.

About the organic semiconductor material, only a single species thereof may be used, or two or more species may be used in the step. An organic polymer may be blended with the organic semiconductor material. Examples of the organic polymer to be blended include polystyrene, polystyrene derivatives, polymethyl methacrylate resins, polyvinylcarbazoles, and polytriallylamines. Besides the organic polymers described herein, an ordinary organic polymer is usable.

The method for forming the organic semiconductor layer in the step is not particularly limited as far as the method is a method capable of forming the organic semiconductor layer at least on the region where the source electrode and the drain electrode to cover the source electrode and the drain electrode. Examples of this method include spin coating, blade coating, ink-jetting, flexographic, micro-contact printing, and screen printing methods in each of which an organic-semiconductor-layer-forming coating liquid that contains the organic semiconductor material is used and the coating liquid is coated onto the whole of the surface of a substrate on which the source electrode and the drain electrode are formed.

The thickness of the organic semiconductor layer formed in the step is not particularly limited as far as the thickness is within a range permitting the organic semiconductor layer having desired semiconductor properties to be formed in accordance with the species of the organic semiconductor material, and other factors. Usually, the thickness ranges preferably from 1 nm to 1 μm, more preferably from 5 nm to 500 nm, and even more preferably from 10 nm to 300 nm.

The source electrode and the drain electrode used in the step are electrodes formed to be opposed to each other at a given interval. The interval set between the source electrode and the drain electrode creates a channel region. The constituent material of the source electrode and the drain electrode is not particularly limited as far as the material is a conductive material having a desired conductivity. Examples of the conductive material include inorganic materials such as Ta, Ti, Al, Zr, Cr, Nb, Hf, Mo, Au, Ag, Pt, Cu, Mo—Ta alloy, ITO (indium tin oxide), and IZO (indium zinc oxide); and conductive organic materials such as PEDOT/PSS (polyethylene dioxythiophene/polystyrene sulfonic acid). The source electrode and the drain electrode may be made of a single conductive material or two or more conductive materials. In the source electrode and the drain electrode, the same conductive material may be used, or conductive materials different from each other may be used.

Between the source electrode and the drain electrode used in the step, a channel region is formed. Usually, the distance between the source electrode and the drain electrode ranges preferably from 0.1 μm to 1 mm, more preferably from 0.5 μm to 200 μm, and even more preferably from 1 μm to 100 μm.

The thickness of the source electrode and the drain electrode used in the step is not particularly limited as far as the thickness is within a range permitting the electrodes to attain a desired electric resistance in accordance with the species of the used conductive material. Usually, the thickness ranges preferably from 1 nm to 1 μm, more preferably from 10 nm to 200 nm, and even more preferably from 20 nm to 100 nm.

(2) First Dielectric Layer Formation Step

The following describes the first dielectric layer formation step in the present embodiment. This step is a step of forming a first dielectric layer on the organic semiconductor layer to be positioned at least on the channel region between the source electrode and the drain electrode.

The first dielectric layer formed in the step is a layer which has a desired insulating performance, does not invade the organic semiconductor layer, and has a function as a protective layer for preventing the following at the time of forming a second dielectric layer in the above-mentioned second dielectric layer formation step: the material of the second dielectric layer penetrates the organic semiconductor layer. Accordingly, the method for forming the first dielectric layer in the step is not particularly limited as far as the method is a method capable of forming the first dielectric layer having the above-mentioned function on the organic semiconductor layer to be positioned at least on the channel region between the source electrode and the drain electrode. Example of this method include a method of using a first-dielectric-layer-forming coating liquid containing the material of the first dielectric layer and a solvent which does not produce any effect onto the organic semiconductor layer, and coating the coating liquid onto a predetermined region on the surface of the organic semiconductor layer, and a method of using a target of the material of the first dielectric layer to evaporate and deposit the material of the first dielectric layer onto a predetermined region on the surface of the organic semiconductor layer.

When the method for forming the first dielectric layer in the step is the method of coating the first-dielectric-layer-forming coating liquid, examples of the material of the first dielectric layer used in the step include fluororesins such as PTFE and CYTOP (manufactured by Asahi Glass Co., Ltd.), acrylic resins, phenolic resins, epoxy resins, cardo resins, vinyl resins, imide resins, and novolak resins. Among these examples, fluororesins are preferred since the resins do not easily invade the organic semiconductor layer. About the material of the first dielectric layer, only a single species thereof may be used, or two or more species thereof may be used in the step.

The solvent used in the first-dielectric-layer-forming coating liquid is not particularly limited as far as the solvent is a solvent which does not produce any effect onto the organic semiconductor layer. Examples thereof include fluorine-containing solvents such as FLUORINERT™ (manufactured by Sumitomo 3M Ltd.), water, toluene, benzene, chlorobenzene, dichlorobenzene, chloroform, tetralin, xylene, anisole, dichloromethane, γ butyrolactone, butyl cellosolve, cyclohexane, NMP (N-methyl-2-pyrrolidone), dimethylsulfoxide, cyclohexanone, dioxane, THF (tetrahydrofuran), PGME (propylene glycol monomethyl ether), PGMEA (propylene glycol monomethyl ether acetate), ethyl lactate, DMAc (N,N-dimethylacetamide), MEK (methyl ethyl ketone), MIBK (methyl isobutyl ketone), IPA (isopropyl alcohol), and ethanol. Among these examples, fluorine-containing solvents are preferred.

The method for coating the first-dielectric-layer-forming coating liquid in the present step is not particularly limited as far as the method makes it possible to form a desired layer as the first dielectric layer. Examples thereof include microcontact printing, ink-jetting, screen printing, and flexographic methods.

When the method for forming the first dielectric layer in the step is the method of evaporating and depositing the material of the first dielectric layer, examples of the material of the first dielectric layer used in the step include organic materials such as fluororesins and polyparaxylene, and inorganic materials such as $SiO_2$ (silicon dioxide), $SiN_x$ (silicon nitride), and $Al_2O_3$ (aluminum oxide). Among these examples, fluororesins are preferred since the resins do not easily give any damage to the organic semiconductor layer when the resins are each formed into the first dielectric layer. About the material of the first dielectric layer, only a single species may be used, or two or more species thereof may be used in the step.

The method for evaporating and depositing the material of the first dielectric layer in the step is not particularly limited as far as the method makes it possible to form a desired layer as the first dielectric layer. Examples thereof include CVD methods such as plasma CVD, thermal CVD and laser CVD, vacuum deposition, sputtering, and ion plating.

When a second-dielectric-layer-forming coating liquid is coated in the second dielectric layer formation step, which will be detailed later, to form a second dielectric layer, the material of the first dielectric layer is a material which a solvent used in the second-dielectric-layer-forming coating liquid does not penetrate, either, regardless of the above-mentioned method for forming the first dielectric layer.

In the meantime, in a case of the second dielectric layer formation step, which will be detailed later, a second-dielectric-layer-forming resin is bonded under pressure to form a second dielectric layer and the second-dielectric-layer-forming resin is a thermoplastic resin, the material of the first dielectric layer is a material which can endure the bonding-under-pressure temperature of the second-dielectric-layer-forming resin regardless of the above-mentioned method for forming the first dielectric layer. Usually, the bonding-under-pressure temperature is a temperature higher than the glass transition point (Tg) of the second-dielectric-layer-forming resin, and is preferably a temperature higher than the softening point (Ts) of the second-dielectric-layer-forming resin. Thus, the Tg of the material of the first dielectric layer is, at lowest, higher than the Tg of the second-dielectric-layer-forming resin, and is preferably a temperature higher than the Ts of the second-dielectric-layer-forming resin.

The thickness of the first dielectric layer formed in the step is not particularly limited as far as the thickness is within a range permitting the layer to have a desired insulating performance, and permitting the material of the second dielectric layer to be prevented from penetrating the organic semiconductor layer. Usually, the thickness ranges preferably from 10 nm to 100 μm, more preferably from 50 nm to 10 μm, and even more preferably from 100 nm to 1 μm.

(3) Second Dielectric Layer Formation Step

The following describes the second dielectric layer formation step in the embodiment. This step is a step of forming a second dielectric layer on the organic semiconductor layer to cover the first dielectric layer. The second dielectric layer formed in the step has a contact portion contacting the organic semiconductor layer around the first dielectric layer. By the formation of the second dielectric layer in the step, a mixed layer in which the organic semiconductor layer and the second dielectric layer are mixed with each other is formed in an interface between the organic semiconductor layer and the second dielectric layer in the contact portion.

The method for forming the second dielectric layer in the step is not particularly limited as far as the method makes it possible to form the second dielectric layer on the organic semiconductor layer to cover the first dielectric layer and further form the mixed layer, in which the organic semiconductor layer and the second dielectric layer are mixed with each other, in the interface between the organic semiconductor layer and the second dielectric layer. The method is, for example, a method of using a second-dielectric-layer-forming coating liquid containing the material of the second dielectric layer and a solvent penetrating the organic semiconductor layer, and coating the coating liquid onto the whole of the surface of the organic semiconductor layer on which the first dielectric layer is formed, or a method of using a second-dielectric-layer-forming resin as the material of the second dielectric layer, and bonding this resin under pressure onto the whole of the surface of the organic semiconductor layer on which the first dielectric layer is formed.

In the present step, in the case of coating the second-dielectric-layer-forming coating liquid, which contains the material of the second dielectric layer and the solvent penetrating the organic semiconductor layer, to form the second dielectric layer, the solvent penetrates the organic semiconductor layer when the coating liquid is coated onto the organic semiconductor layer. This manner makes it possible to disperse the material of second dielectric layer into the organic semiconductor layer to form the mixed layer.

The material of the second dielectric layer used in the second-dielectric-layer-forming coating liquid is usually a material high in resistivity from the viewpoint of lowering the organic semiconductor layer in conductivity by the mixing of this material with the organic semiconductor layer so that the organic semiconductor layer is patterned, and the viewpoint that the second dielectric layer formed in the step functions as a passivation layer. For example, the volume resistivity thereof is preferably $1 \times 10^9$ Ω·m or more. The volume resistivity of the material of the second dielectric layer is measurable by a method according to, for example, JIS K6911, JIS C2318, ASTM D257 or some other standard.

The material of the second dielectric layer may be an organic material, an inorganic material, or an organic/inorganic hybrid material. The material is in particular preferably an organic polymeric material since the organic polymeric material is low in process temperature not to give any damage easily onto organic semiconductor material, which is generally weak against high-temperature process. Examples of the organic polymeric material usable in the second-dielectric-layer-forming coating liquid include acrylic resins, phenolic resins, fluororesins, epoxy resins, cardo resins, vinyl resins, imide resins, and novolak resins. Among these resins, epoxy resins and fluororesins are preferred since these materials are low in process temperature not to give any damage easily onto organic semiconductor material, which is generally weak against high-temperature process.

The solvent used in the second-dielectric-layer-forming coating liquid is not particularly limited as far as the solvent penetrates the organic semiconductor layer. Examples thereof include toluene, benzene, chlorobenzene, dichlorobenzene, chloroform, tetralin, xylene, anisole, dichloromethane, γbutyrolactone, butyl cellosolve, cyclohexane, NMP (N-methyl-2-pyrrolidone), dimethylsulfoxide, cyclohexanone, dioxane, THF (tetrahydrofuran), PGME (propylene glycol monomethyl ether), PGMEA (propylene glycol monomethyl ether acetate), ethyl lactate, DMAc (N,N-dimethylacetamide), MEK (methyl ethyl ketone), MIBK (methyl isobutyl ketone), IPA (isopropyl alcohol), and ethanol. Among these examples, alcohol solvents and fluorine-containing solvents are preferred since the solvents do not easily penetrate side surfaces of the organic semiconductor layer protected by the first dielectric layer.

Examples of the method for coating the second-dielectric-layer-forming coating liquid in the step include spin coating, blade coating, dipping, spraying, screen printing and flexographic methods.

In the meantime, in the case of bonding the second-dielectric-layer-forming resin as the material of the second dielectric layer under pressure in the step to form the second dielectric layer, it can be supposed that the second-dielectric-layer-forming resin contacts the organic semiconductor layer when this resin is in a soft state, so that the resin can be dispersed in the organic semiconductor layer to form the mixed layer.

The second-dielectric-layer-forming resin is usually a resin high in resistivity from the viewpoint of lowering the organic semiconductor layer in conductivity by the mixing of the resin with the organic semiconductor layer so that the organic semiconductor layer is patterned, and the viewpoint that the second dielectric layer formed in the step functions as a passivation layer. For example, the volume resistivity thereof is preferably $1 \times 10^9$ Ω·m or more. The volume resistivity of the second-dielectric-layer-forming resin is measurable by the same method as described above. The second-dielectric-layer-forming resin may be a resin bondable under pressure and heat, or a resin bondable under pressure at normal temperature.

The second-dielectric-layer-forming resin to be bonded under pressure and heat is, for example, a thermoplastic resin, which is heated to have adhesiveness. Specific examples thereof include aromatic vinyl resins such as polystyrene, vinyl cyanide resins such as polyacrylonitrile, chlorine-containing resins such as polyvinyl chloride, polymethacrylate and polyacrylate resins such as polymethyl methacrylate, polyolefin resins such as polyethylene, polypropylene and cyclic polyolefin resins, polyvinyl ester resins such as polyvinyl acetate, polyvinyl alcohol resins and derivative resins thereof, polymethacrylic acid resins, polyacrylic acid resins and metal salts of these resins, poly(conjugated diene) resins, polymers obtained by polymerizing maleic acid, fumaric acid and derivatives thereof, respectively, polymers each obtained by polymerizing a maleimide compound, amorphous polyester resins such as amorphous semi-aromatic polyesters and amorphous wholly aromatic polyesters, crystalline polyester resins such as crystalline semi-aromatic polyesters and crystalline wholly aromatic polyesters, polyamide resins such as aliphatic polyamides, aliphatic-aromatic polyamides and wholly aromatic polyamides, polycarbonate resins, polyurethane resins, polysulfone resins, polyalkylene oxide resins, cellulose resins, polyphenylene ether resins, polyphenylene sulfide resins, polyketone resins, polyimide resins, polyamideimide resins, polyetherimide resins, polyetherketone resins, polyetheretherketone resins, polyvinyl ether resins, phenoxy resins, fluororesins, silicone resins, and liquid crystal polymers; and random, block and graft copolymers of these polymers given as the examples. Among these examples, preferred are polyethylene terephthalate, polymethyl methacrylate, polypropylene and others. These have a glass transition temperature of approximately 60 to 120° C. not to be softened at room temperature after the organic semiconductor element is manufactured, and these do not easily give any damage to organic semiconductor material, which is generally weak against high-temperature process.

When the second-dielectric-layer-forming resin is bonded under pressure and heat, the bonding-under-pressure temperature is usually a temperature higher than the glass transition point (Tg) of this resin, and is preferably a temperature higher than the softening point (Ts) of the resin. The bonding-under-pressure temperature is appropriately set in accordance with the second-dielectric-layer-forming resin used in the present step, and ranges usually from 50 to 200° C.

The second-dielectric-layer-forming resin to be bonded under pressure at normal temperature is, for example, an adhesive resin having adhesiveness at normal temperature. Specific examples thereof include polyimides, polyamides, polyesters, polyacrylates, photocurable resins such as radical photopolymerizable resins and cation photopolymerizable resins, PU (polyurethane), phenolic resins, urea resins, melamine resins, guanamine resins, vinyl ester resins, unsaturated polyesters, oligoester acrylates, diallyl phthalate, DKF resins (the resins are each a kind of resorcinol resin), xylene resins, epoxy resins, furan resins, PI (polyimide) resins, PEI (polyetherimide) resins, PAI (polyamideimide) resins, and other thermosetting resins.

In the step, the second-dielectric-layer-forming resin may be bonded alone under pressure, or bonded under pressure in the form of a laminate in which the resin is formed on any substrate. In the latter case, the substrate may or may not be peeled off after the bonding under the pressure. The method for bonding the second-dielectric-layer-forming resin under pressure in the step is, for example, a thermal bonding-under-pressure method in which a roller is heated while the resin is bonded onto a substrate thereby.

The thickness of the second dielectric layer formed in the step is not particularly limited as far as the thickness is within a range permitting the mixed layer to be formed so as to have a thickness making it possible to pattern the organic semiconductor layer, and further permitting the second dielectric layer to have a mechanical strength sufficient for being capable of functioning as a passivation layer. Usually, the thickness ranges preferably from 0.1 μm to 1000 μm, more preferably from 0.5 μm to 200 μm, and even more preferably from 1 μm to 50 μm.

Figure 2A:
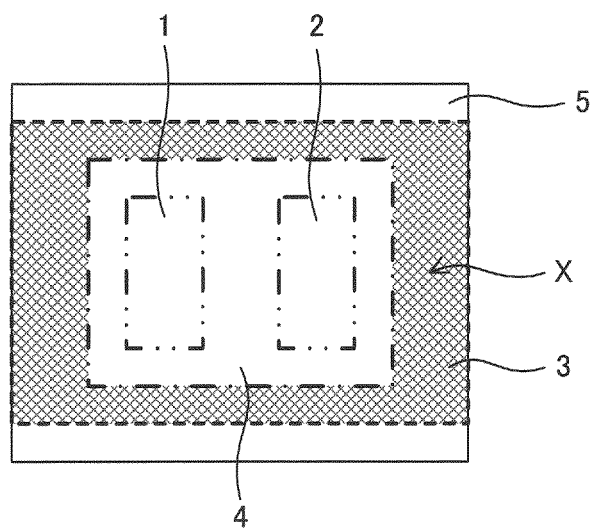
FIGS. 2A and 2B are each an explanatory view demonstrating a contact portion in the method for manufacturing an organic semiconductor element of the invention.
Figure 2B:
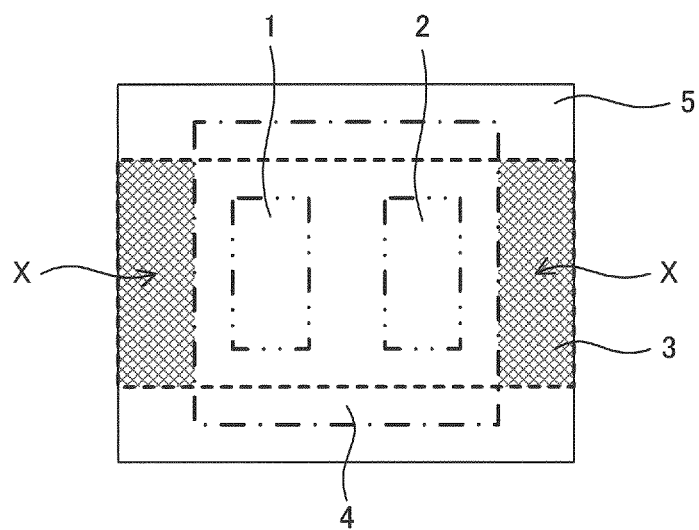

The second dielectric layer formed in the step has a contact portion contacting the organic semiconductor layer around the first dielectric layer. When the contact portion is viewed in planar view from the second dielectric layer side thereof, the contact portion may be a contact portion X as illustrated in FIG. 2A, in which the second dielectric layer 5 contacts the organic semiconductor layer 3 wholly around the first dielectric layer 4, or may be a contact portion X as illustrated in FIG. 2B, in which the second dielectric layer 5 contacts the organic semiconductor layer 3 partially around the first dielectric layer 4. FIGS. 2A and 2B are each an explanatory view demonstrating the contact portion in the method for manufacturing an organic semiconductor element of the present embodiment. In FIGS. 2A and 2B, the organic semiconductor layer 3 is represented by dot lines; the first dielectric layer 4 by an alternate long and short dash line; and each of the source electrode 1 and the drain electrode 2 by an alternate long and two short dashes line.

In the present embodiment, the second dielectric layer is formed in the step, thereby forming a mixed layer in which the organic semiconductor layer and the second dielectric layer are mixed with each other to constitute, in the contact portion, an interface between the organic semiconductor layer and the second dielectric layer. By the formation of the mixed layer, the organic semiconductor layer of the region where the mixed layer is formed is lowered in conductivity while the organic semiconductor layer of the region protected by the first dielectric layer, where the mixed layer is not formed, keeps conductivity. It is therefore possible to pattern the organic semiconductor layer without lowering the mobility of the organic semiconductor layer. The formation of the mixed layer can be checked, for example, on the basis of whether or not the organic semiconductor layer can be recognized when the organic semiconductor element manufactured according to the embodiment is observed from the second dielectric layer side thereof through a microscope. In other words, the region where the mixed layer is formed looks transparent since the organic semiconductor layer is mixed with the second dielectric layer to be dissolved. By contrast, in the region where the mixed layer is not formed looks colored since the organic semiconductor layer is left to remain. For example, in the region where the mixed layer is formed, it can be verified that crystal pieces of the second-dielectric-layer-constituting material (for example, an organic polymer material) mixed with the organic semiconductor layer are sparsely dispersed. Furthermore, the formation of the mixed layer composed of the second dielectric layer and the organic semiconductor layer can be verified by observing respective peaks originating from the organic semiconductor layer and the second dielectric layer through measurement of a chemical state of the mixed region composed of the second dielectric layer and the organic semiconductor layer, using an angle resolved microdomain X-ray photoelectron spectrometer (Theta Probe™, manufactured by Thermofisher Scientific Inc.).

In the mixed layer, the respective blend concentrations of the organic semiconductor layer and the second dielectric layer may each have an inclination, or may be uniform. As the mixed layer becomes thicker, the mixed layer is more favorable for patterning the organic semiconductor layer. It is particularly preferred that the mixed layer is formed from the interface between the organic semiconductor layer and the second dielectric layer to the organic semiconductor layer bottom surface at the second-dielectric-layer-not-formed side of the organic semiconductor layer. The thickness of the mixed layer is varied in accordance with the structure of the organic semiconductor element manufactured according to the present embodiment, and other factors, and usually ranges from 1 nm to 1 μm.

(4) Different Step(s)

The method for manufacturing an organic semiconductor element of the embodiment has at least one the organic semiconductor layer formation step, the first dielectric layer formation step, and the second dielectric layer formation step. If necessary, the method may have one or more different steps. The different step(s) used in the embodiment is/are not particularly limited, and may (each) be any step in accordance with a use purpose of the organic semiconductor element manufactured in the embodiment, and other factors. Before the organic semiconductor layer formation step, the embodiment may have, as the different step, the source electrode and drain electrode formation step, which is a step of using an electrode laminated body having a substrate, a gate electrode formed on the substrate and a gate insulating layer formed on the substrate so as to cover the gate electrode to form the above-mentioned source electrode and drain electrode on the gate insulating layer of the electrode laminated body. When the method has the source electrode and drain electrode formation step, an organic semiconductor element of a bottom-gate/bottom-contact type can be formed.

As have been illustrated in FIGS. 1A to 1E, when the method for manufacturing an organic semiconductor element of the embodiment has the source electrode and drain electrode formation step, for example, the electrode laminated body 14 is used, which has the substrate 11, the gate electrode 12 formed on the substrate 11, and the gate insulating layer 13 formed on the substrate 11 to cover the gate electrode 12 (FIG. 1A); the source electrode 1 and the drain electrode 2 are formed on the gate insulating layer 13 of the electrode laminated body 14 (FIG. 1B, source electrode and drain electrode formation step); the organic semiconductor layer 3 is formed to cover the source electrode 1 and the drain electrode 2 (FIG. 1C, organic semiconductor layer formation step); the first dielectric layer 4 is formed on the organic semiconductor layer 3 to be positioned at least on the channel region C between the source electrode 1 and the drain electrode 2 (FIG. 1D, first dielectric layer formation step); the second dielectric layer 5 is formed on the organic semiconductor layer 3 to cover the first dielectric layer 4 (FIG. 1E, second dielectric layer formation step); and in this way, the organic semiconductor element 10 is manufactured (FIG. 1E). As has been illustrated in FIG. 1E, the second dielectric layer 5 has the contact portion X, which contacts the organic semiconductor layer 3 around the first dielectric layer 4, and the mixed layer 6, in which the organic semiconductor layer 3 and the second dielectric layer 5 are mixed with each other, is formed in the interface between the organic semiconductor layer 3 and the second dielectric layer 5 in the contact portion X.

The substrate used in the electrode laminated body is not particularly limited, and may be appropriately decided in accordance with a use purpose of the organic semiconductor element manufactured according to the embodiment, and other factors. Accordingly, the substrate may be a flexible substrate, which has flexibility, or may be a rigid substrate, which has no flexibility. Specific examples of the substrate include substrates each made of polyimide, polyethylene naphthalate, polyethylene terephthalate, polyethersulfone, polycarbonate, polyetherimide, polyetheretherketone, polyetherketone, polyphenylene sulfide, liquid crystal polymer, epoxy resin, silicone resin, or phenolic resin; a glass substrate; and a SUS substrate.

The thickness of the substrate is appropriately decided in accordance with the species of the substrate, and other factors. Usually, the thickness is preferably 1 mm or less, and ranges in particular preferably from 1 µm to 70 µm.

The gate electrode used in the electrode laminated body is an electrode formed on the substrate. The gate electrode is usually formed into a predetermined pattern on the substrate. The gate electrode is not particularly limited as far as the electrode is made of a conductive material having a desired conductivity. The material may be a conductive material that is generally used for a gate electrode of an organic transistor. Examples of the conductive material include inorganic materials such as Ta, Ti, Al, Zr, Cr, Nb, Hf, Mo, Au, Ag, Pt, Mo—Ta alloy, ITO, and IZO; and conductive organic materials such as PEDOT/PSS.

The thickness of the gate electrode is appropriately decided within a range permitting the electrode to attain a desired conductivity in accordance with the species of the conductive material used to form the gate electrode, and other factors. Usually, the thickness is preferably from 10 nm to 1 µm.

The gate insulating layer used in the electrode laminated body is a layer formed on the substrate to cover the gate electrode. This layer is a layer having a function of insulating the source electrode and the drain electrode electrically from the gate electrode in the organic semiconductor element manufactured according to the embodiment. The material constituting the gate insulating layer is not particularly limited as far as the material is an insulating material having a desired insulating performance. Examples of the insulating material include organic materials such as acrylic resins, phenolic resins, fluororesins, epoxy resins, cardo resins, vinyl resins, imide resins, novolak resins, and polyparaxylene; and inorganic materials such as $SiO_2$, $SiN_x$, and $Al_2O_3$. About the insulating material, only a single species thereof, or two or more species thereof may be used in the gate insulating layer.

The thickness of the gate insulating layer is appropriately decided within a range permitting the layer to attain a desired insulating performance in accordance with the species of the insulating material used to form the gate insulating layer, and other factors. Usually, the thickness ranges preferably from 10 nm to 5 µm.

In the source electrode and drain electrode formation step, the method for forming the source electrode and the drain electrode is not particularly limited as far as the method makes it possible to form each of the source electrode and the drain electrode to have a shape decided in advance, using a desired conductive material. Examples of the method include CVD methods such as plasma CVD, thermal CVD and laser CVD, PVD methods such as vacuum deposition, sputtering and ion plating, electroplating, immersion plating, electroless plating, a sol-gel method, and a metal organic decomposition (MOD) method. The constituent material used to form the source electrode and the drain electrode in the source electrode and drain electrode formation step is the same as described in the subitem "(1) Organic semiconductor layer formation step".

The manufacturing method in the embodiment may have, as one of the above-mentioned different steps, the source electrode and drain electrode formation step, in which a substrate is used and the above-mentioned source electrode and drain electrode are formed on the substrate, before the organic semiconductor layer formation step; and may also have, as another of the different steps, a gate electrode formation step of forming a gate electrode on the first dielectric layer between the first dielectric layer formation step and the second dielectric layer formation step, or another gate electrode formation step of forming a gate electrode on the second dielectric layer after the second dielectric layer formation step. When the method has the source electrode and drain electrode formation step and either one of the gate electrode formation steps, an organic semiconductor element of a top-gate/bottom-contact type can be formed.

Figure 3A:
FIGS. 3A to 3F are a process chart illustrating a different example of the method for manufacturing an organic semiconductor element of the first embodiment of the invention.
Figure 3B:
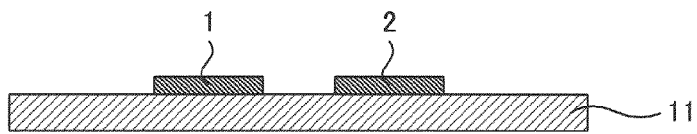
Figure 3C:
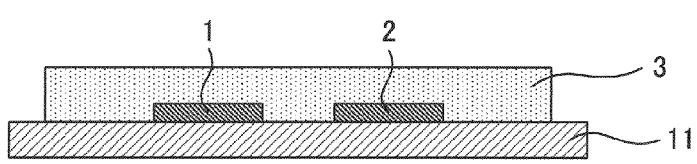
Figure 3D:
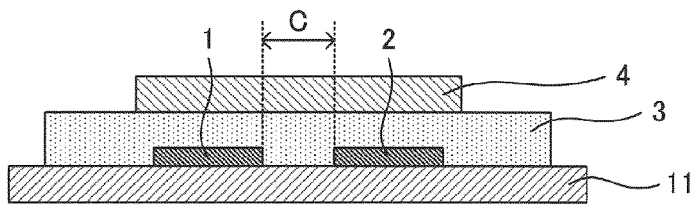
Figure 3E:
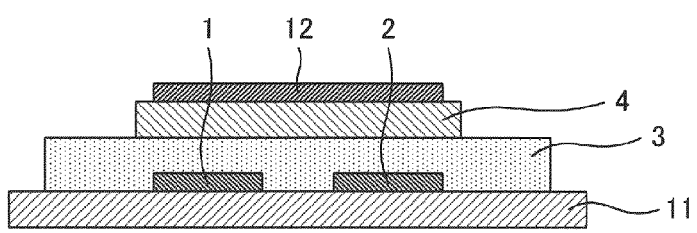
Figure 3F:
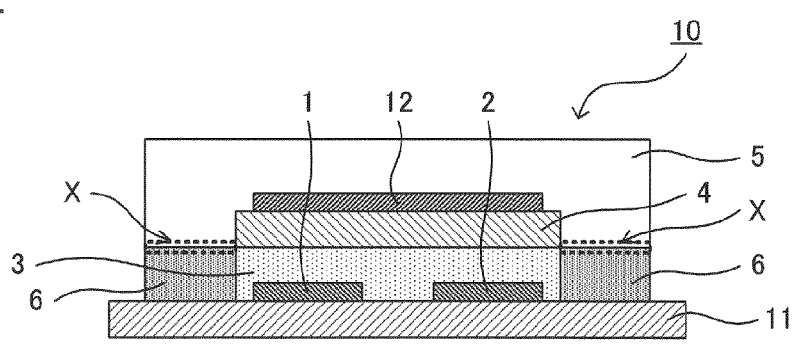

When the method for manufacturing an organic semiconductor element of the embodiment has the source electrode and drain electrode formation step and the former gate electrode formation step, for example, the following is performed as illustrated in FIGS. 3A to 3F: a substrate 11 is used (FIG. 3A), and a source electrode 1 and a drain electrode 2 are formed on the substrate 11 (FIG. 3B, source electrode and drain electrode formation step); an organic semiconductor layer 3 is formed to cover the source electrode 1 and the drain electrode 2 (FIG. 3C, organic semiconductor layer formation step); a first dielectric layer 4 is formed on the organic semiconductor layer 3 to be positioned at least on a channel region C between the source electrode 1 and the drain electrode 2 (FIG. 3D, first dielectric layer formation step); a gate electrode 12 is formed on the first dielectric layer 4 (FIG. 3E, gate electrode formation step); a second dielectric layer 5 is formed on the organic semiconductor layer 3 to cover the gate electrode 12 and the first dielectric layer 4 (FIG. 3F, second dielectric layer formation step); and in this way, an organic semiconductor element 10 is manufactured (FIG. 3F). In this process, as illustrated in FIG. 3F, the second dielectric layer 5 has a contact portion X contacting the organic semiconductor layer 3 around the first dielectric layer 4, and a mixed layer 6 in which the organic semiconductor layer 3 and the second dielectric layer 5 are mixed with each other is formed to constitute, in the contact portion X, an interface between the organic semiconductor layer 3 and the second dielectric layer 5. FIGS. 3A to 3F are a process chart of the example, which is a different example of the method for manufacturing an organic semiconductor element of the embodiment.

In this gate electrode formation step, the method for forming the gate electrode is not particularly limited as far as the method makes it possible to form the gate electrode to have a shape decided in advance, using a desired conductive material. Examples of the method include CVD methods such as plasma CVD, thermal CVD and laser CVD, dry methods such as vacuum deposition, sputtering and ion plating, and wet methods such as electroplating, immersion plating, electroless plating, a sol-gel method, a metal organic decomposition (MOD) method, spin coating and die coating.

The constituent material used to form the gate electrode in the gate electrode formation step, and the thickness of the formed gate electrode are the same as described above.

The substrate used in the source electrode and drain electrode formation step, the respective thicknesses of the source electrode and the drain electrode, and methods for forming these electrodes, respectively, are the same as described above.

Figure 4A:
FIGS. 4A to 4F are a process chart illustrating a different example of the method for manufacturing an organic semiconductor element of the first embodiment of the invention.
Figure 4B:
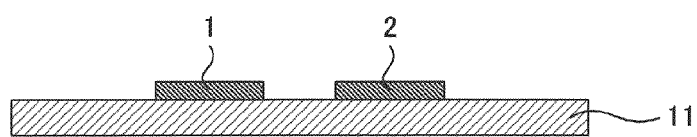
Figure 4C:
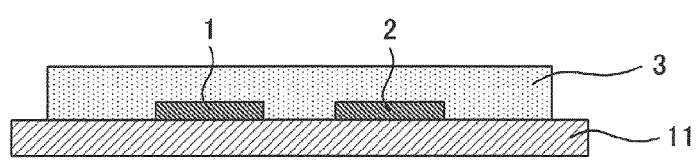
Figure 4D:
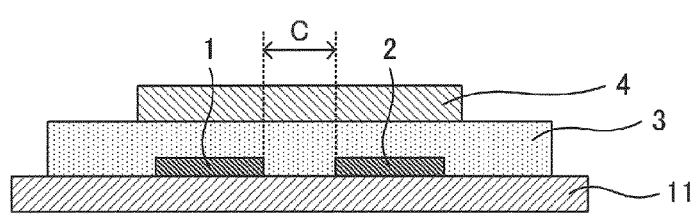
Figure 4E:
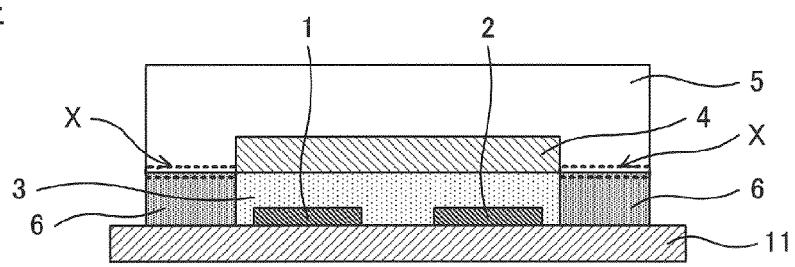
Figure 4F:
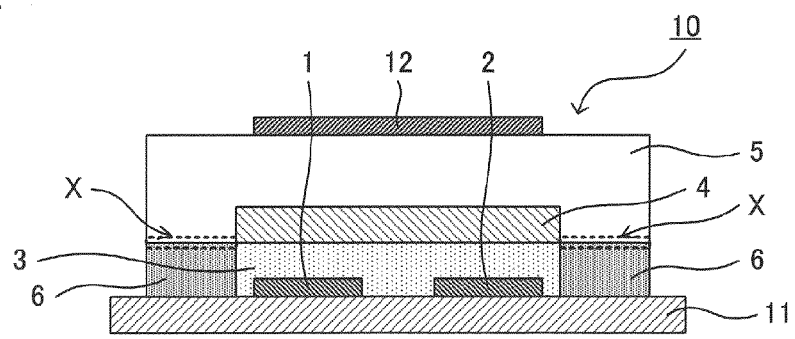

In the meantime, when the method for manufacturing an organic semiconductor element of the embodiment has the source electrode and drain electrode formation step and the latter gate electrode formation step, for example, the following is performed as illustrated in FIGS. 4A to 4F: a substrate 11 is used (FIG. 4A), and a source electrode 1 and a drain electrode 2 are formed on the substrate 11 (FIG. 4B, source electrode and drain electrode formation step); an organic semiconductor layer 3 is formed to cover the source electrode 1 and the drain electrode 2 (FIG. 4C, organic semiconductor layer formation step); a first dielectric layer 4 is formed on the organic semiconductor layer 3 to be positioned at least on a channel region C between the source electrode 1 and the drain electrode 2 (FIG. 4D, first dielectric layer formation step); a second dielectric layer 5 is formed on the organic semiconductor layer 3 to cover the first dielectric layer 4 (FIG. 4E, second dielectric layer formation step); a gate electrode 12 is formed on the second dielectric layer 5 (FIG. 4F, gate electrode formation step); and in this way, an organic semiconductor element 10 is manufactured (FIG. 4F). In this process, as illustrated in FIG. 4F, the second dielectric layer 5 has a contact portion X contacting the organic semiconductor layer 3 around the first dielectric layer 4, and a mixed layer 6 in which the organic semiconductor layer 3 and the second dielectric layer 5 are mixed with each other is formed to constitute, in the contact portion X, an interface between the organic semiconductor layer 3 and the second dielectric layer 5. FIGS. 4A to 4F are a process chart of the example, which is a different example of the method for manufacturing an organic semiconductor element of the embodiment.

In this gate electrode formation step, the method for forming the gate electrode is not particularly limited as far as the method makes it possible to form the gate electrode to have a shape decided in advance, using a desired conductive material. Examples of the method include CVD methods such as plasma CVD, thermal CVD and laser CVD, dry methods such as vacuum deposition, sputtering and ion plating, and wet methods such as electroplating, immersion plating, electroless plating, a sol-gel method, a metal organic decomposition (MOD) method, spin coating and die coating.

The constituent material used to form the gate electrode in the gate electrode formation step, and the thickness of the formed gate electrode are the same as described above.

The source electrode and drain electrode formation step is the same as described above.

Figure 5A:
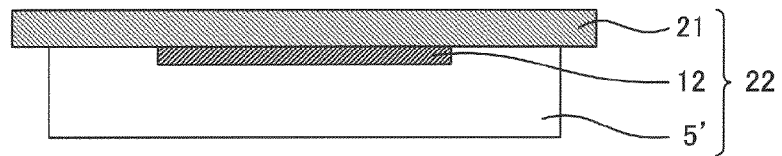
FIGS. 5A and 5B are a process chart illustrating an example of a second dielectric layer formation step in the method for manufacturing an organic semiconductor element of the first embodiment of the invention.
Figure 5B:
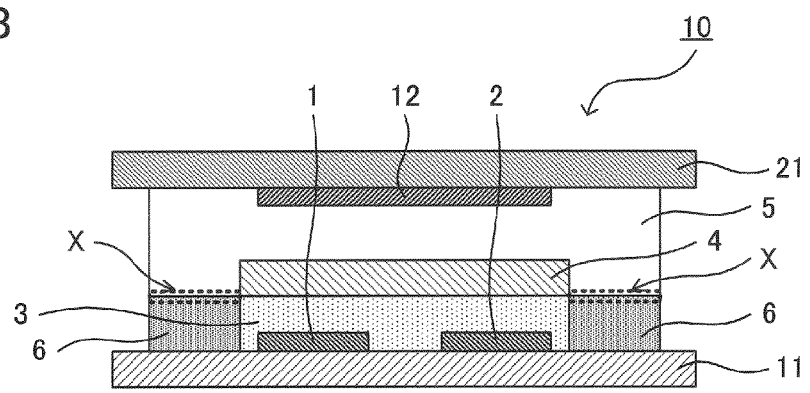
Figure 6A:
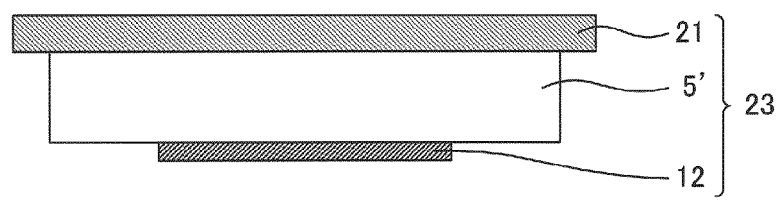
FIGS. 6A and 6B are a process chart illustrating an example of the second dielectric layer formation step in the method for manufacturing an organic semiconductor element of the first embodiment of the invention.
Figure 6B:
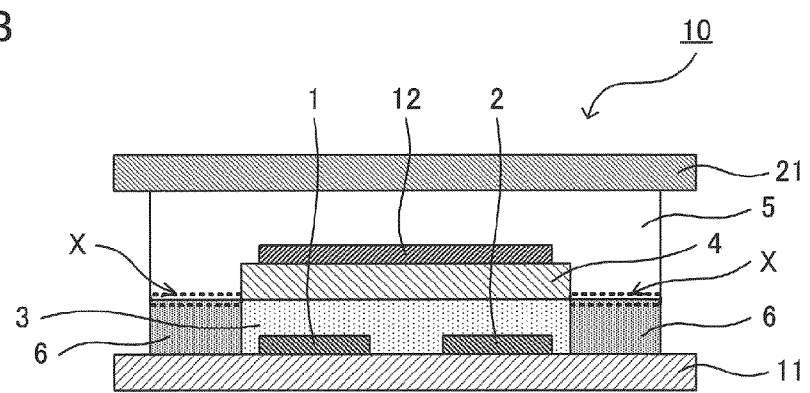

When an organic semiconductor element of a top-gate/bottom-contact type is manufactured by the method for manufacturing an organic semiconductor element of the embodiment, instead of the method has any one of the above-mentioned gate electrode formation steps, the second dielectric layer formation step in the embodiment may a step as illustrated in FIGS. 5A and 5B, in which a laminated body 22 is used which has an arbitrary substrate 21, a gate electrode 12 formed on the substrate 21 and a second-dielectric-layer-forming resin 5' laminated on the substrate 21 to cover the gate electrode 12 (FIG. 5A), and this laminated body 22 is bonded under pressure to arrange the gate electrode 12 on the first dielectric layer 4, thereby forming a second dielectric layer 5 on the organic semiconductor layer 3 to cover the first dielectric layer 4 (FIG. 5B); or a step as illustrated in FIGS. 6A and 6B, in which a laminated body 23 is used which has an arbitrary substrate 21, a second-dielectric-layer-forming resin 5' laminated on the substrate 21, and a gate electrode 12 formed on the second-dielectric-layer-forming resin 5' (FIG. 6A), and this laminated body 23 is bonded under pressure to arrange the gate electrode 12 on the first dielectric layer 4, thereby forming a second dielectric layer 5 on the organic semiconductor layer 3 to cover the first dielectric layer 4 (FIG. 6B). In this case, after the second dielectric layer formation step, the substrate 21 may or may not be peeled off. FIGS. 5A and 5B, as well as FIGS. 6A and 6B, are a process chart illustrating one of the examples referred to herein, which is an example of the second dielectric layer formation step in the method for manufacturing an organic semiconductor element of the embodiment. Reference signs not referred to represent the same members as in FIGS. 1A to 1E, respectively; thus, any description thereabout is omitted herein.

2. Second Embodiment

The following describes the method of the second embodiment of the invention for manufacturing an organic semiconductor element. The method for manufacturing an organic semiconductor element of the present embodiment comprises steps of: an organic semiconductor layer formation step of forming an organic semiconductor layer to cover a source electrode and a drain electrode, and a first dielectric layer and second dielectric layer formation step of using a dielectric layer laminated body in which a first dielectric layer is formed on a second-dielectric-layer-forming resin, and bonding the dielectric layer laminated body under pressure to arrange the first dielectric layer on the organic semiconductor layer to be positioned at least on a channel region between the source electrode and the drain electrode, thereby forming a second dielectric layer on the organic semiconductor layer to cover the first dielectric layer, wherein the second dielectric layer has a contact portion contacting the organic semiconductor layer around the first dielectric layer, and a mixed layer in which the organic semiconductor layer and the second dielectric layer are mixed with each other is formed in an interface between the organic semiconductor layer and the second dielectric layer in the contact portion.

Figure 7A:
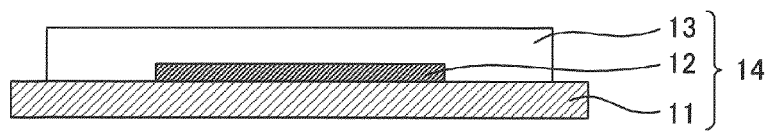
FIGS. 7A to 7E are a process chart illustrating an example of the method for manufacturing an organic semiconductor element of a second embodiment of the invention.
Figure 7B:
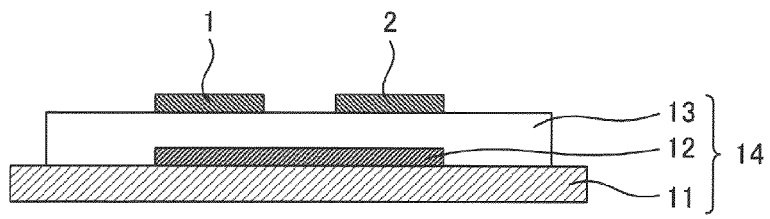
Figure 7C:
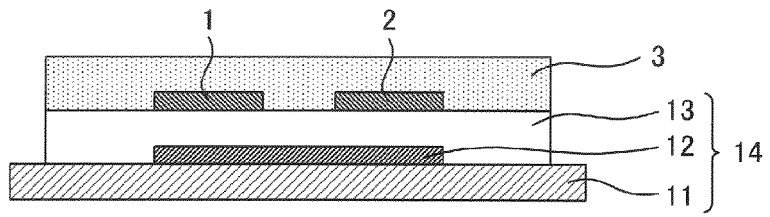
Figure 7D:
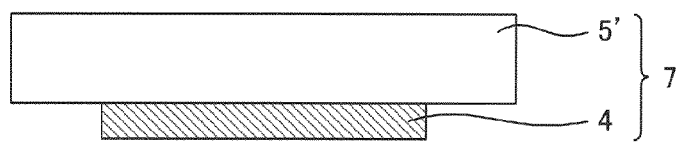
Figure 7E:
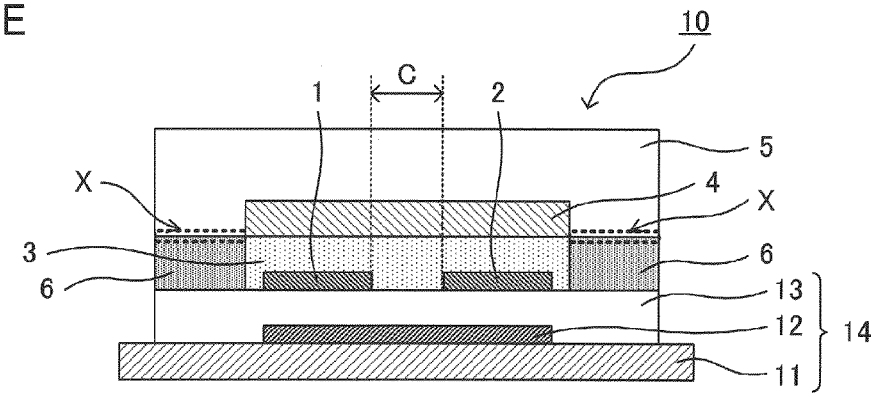

With reference to some of the drawings, the method for manufacturing an organic semiconductor element of the embodiment as referred to just above is described. FIGS. 7A to 7E are a process chart illustrating an example of the method for manufacturing an organic semiconductor element of the second embodiment of the invention. As illustrated in FIGS. 7A to 7E, in the method for manufacturing an organic semiconductor element of the embodiment, an electrode laminated body 14 is used which has a substrate 11, a gate electrode 12 formed on the substrate 11, and a gate insulating layer 13 formed on the substrate 11 to cover the gate electrode 12 (FIG. 7A). The method further comprises: a source electrode and drain electrode formation step (FIG. 7B) of forming a source electrode 1 and a drain electrode 2 on the gate insulating layer 13 of the electrode laminated body 14; an organic semiconductor layer formation step (FIG. 7C) of forming an organic semiconductor layer 3 to cover the source electrode 1 and the drain electrode 2; and a first dielectric layer and second dielectric layer formation step (FIG. 7E) of using a dielectric layer laminated body 7 in which a first dielectric layer 4 is formed on a second-dielectric-layer-forming resin 5' (FIG. 7D), and bonding the dielectric layer laminated body 7 under pressure to arrange the first dielectric layer 4 on the organic semiconductor layer 3 to be positioned at least on a channel region C between the source electrode 1 and the drain electrode 2, thereby forming a second dielectric layer 5 on the organic semiconductor layer 3 to cover the first dielectric layer 4. In this way, an organic semiconductor element 10 is manufactured (FIG. 7E). As illustrated in FIG. 7E, in the method for manufacturing an organic semiconductor element of the present embodiment, additionally, the second dielectric layer 5 has a contact portion X contacting the organic semiconductor layer 3 around the first dielectric layer 4, and a mixed layer 6 in which the organic semiconductor layer 3 and the second dielectric layer 5 are mixed with each other is formed in an interface between the organic semiconductor layer 3 and the second dielectric layer 5 in the contact portion X.

According to the embodiment, the mixed layer is formed in the interface between the organic semiconductor layer and the second dielectric layer, so that the organic semiconductor layer of the region where the mixed layer is formed is lowered in conductivity while the organic semiconductor layer of the region protected by the first dielectric layer, where the mixed layer is not formed, keeps conductivity. It is therefore possible to pattern the organic semiconductor layer without lowering the mobility of the organic semiconductor layer. It is also possible to attain simultaneously the formation of the second dielectric layer, which corresponds to a passivation layer, and the patterning of the organic semiconductor layer.

Thus, the organic semiconductor element manufacturing process can be made simple and easy.

The method for manufacturing an organic semiconductor element of the embodiment comprises at least the organic semiconductor layer formation step, and the first dielectric layer and second dielectric layer formation step, and may, if necessary, comprise one or more optional different steps.

Hereinafter, a description will be made about each of the steps in the method for manufacturing an organic semiconductor element of the embodiment.

The organic semiconductor layer formation step in the embodiment is the same as described in the sub item "(1) Organic semiconductor layer formation step" in the above-mentioned item "1. First embodiment"; thus, any description thereabout is omitted herein.

(1) First Dielectric Layer and Second Dielectric Layer Formation Step

First, a description is made about the first dielectric layer and second dielectric layer formation step in the embodiment. The present step is a step of using a dielectric layer laminated body in which a first dielectric layer is formed on a second-dielectric-layer-forming resin, and bonding this dielectric layer laminated body under pressure to arrange the first dielectric layer on the organic semiconductor layer to be positioned at least on a channel region between the source electrode and the drain electrode, thereby forming a second dielectric layer on the organic semiconductor layer to cover the first dielectric layer. The second dielectric layer formed in this step has a contact portion contacting the organic semiconductor layer around the first dielectric layer. Additionally, by the formation of the second dielectric layer in the step, a mixed layer in which the organic semiconductor layer and the second dielectric layer are mixed with each other is formed in an interface between the organic semiconductor layer and the second dielectric layer in the contact portion.

It can be supposed that when the second-dielectric-layer-forming resin of the dielectric layer laminated body is in a soft state in the step, this resin contacts the organic semiconductor layer so as to be dispersed in the organic semiconductor layer so that the mixed layer can be formed.

The dielectric layer laminated body used in the step is a body in which the first dielectric layer is formed on the second-dielectric-layer-forming resin. The material of the first dielectric layer that is used to form the dielectric layer laminated body, and the thickness of the first dielectric layer formed on the second-dielectric-layer-forming resin are the same as described in the sub item "(2) First dielectric layer formation step" in the item "1. First embodiment". Examples of the second-dielectric-layer-forming resin used to form the dielectric layer laminated body are the same as described in the subitem "(3) Second dielectric layer formation step" in the item "1. First embodiment", and an appropriate resin is selected therefrom in accordance with the method for bonding the dielectric layer laminated body under pressure in the step, so as to be usable. The second-dielectric-layer-forming resin may be a resin laminated on an arbitrary substrate. The substrate may or may not be peeled off after the bonding under pressure. Examples of the method for forming the first dielectric layer on the second-dielectric-layer-forming resin include photolithographic, ink-jetting, micro-contact printing, flexographic, and screen printing methods.

The method for bonding the dielectric layer laminated body under pressure in the step is not particularly limited as far as the method makes it possible to arrange the first dielectric layer on the organic semiconductor layer to be positioned at least on the channel region between the source electrode and the drain electrode. The bonding may be bonding under pressure and heat, or bonding under pressure at normal temperature. The second-dielectric-layer-forming resin used in each of the bonding under pressure and heat, and the bonding under pressure at normal temperature, the bonding-under-pressure temperature for the bonding under pressure and heat, and a specific method for the bonding under pressure are the same as described in the subitem "(3) Second dielectric layer formation step" in the item "1. First embodiment"; thus, any description thereabout is omitted herein.

The thickness of the second dielectric layer formed in the step, and details of the contact portion and the mixed layer are also the same as described in the subitem "(3) Second dielectric layer formation step" in the item "1. First embodiment"; thus, any description thereabout is omitted herein.

(2) Different Step(s)

The method for manufacturing an organic semiconductor element of the embodiment comprises at least the organic semiconductor layer formation step, and the first dielectric layer and second dielectric layer formation step. If necessary, the method may comprise one or more different steps. The different step(s) used in the embodiment is/are not particularly limited, and may (each) be any step in accordance with a use purpose of the organic semiconductor element manufactured in the embodiment, and other factors. Before the organic semiconductor layer formation step, the embodiment may comprise, as the different step, the source electrode and drain electrode formation step, which is a step of using an electrode laminated body having a substrate, a gate electrode formed on the substrate, and a gate insulating layer formed on the substrate so as to cover the gate electrode to form the above-mentioned source electrode and drain electrode on the gate insulating layer of the electrode laminated body. When the embodiment has the source electrode and drain electrode formation step, an organic semiconductor element of a bottom-gate/bottom-contact type can be formed.

As have been illustrated in FIGS. 7A to 7E, when the method for manufacturing an organic semiconductor element of the embodiment comprises: the source electrode and drain electrode formation step, for example, the electrode laminated body 14 is used, which has the substrate 11, the gate electrode 12 formed on the substrate 11, and the gate insulating layer 13 formed on the substrate 11 to cover the gate electrode 12 (FIG. 7A); the source electrode 1 and the drain electrode 2 are formed on the gate insulating layer 13 of the electrode laminated body 14 (FIG. 7B, source electrode and drain electrode formation step); the organic semiconductor layer 3 is formed to cover the source electrode 1 and the drain electrode 2 (FIG. 7C, organic semiconductor layer formation step); the dielectric layer laminated body 7 is used, in which the first dielectric layer 4 is formed on the second-dielectric-layer-forming resin 5' (FIG. 7D), and the dielectric layer laminated body 7 is bonded under pressure to arrange the first dielectric layer 4 on the organic semiconductor layer 3 to be positioned at least on the channel region C between the source electrode 1 and the drain electrode 2, thereby forming the second dielectric layer 5 on the organic semiconductor layer 3 to cover the first dielectric layer 4 (FIG. 7E, first dielectric layer and second dielectric layer formation step); and in this way, the organic semiconductor element 10 is manufactured (FIG. 7E). As has been illustrated in FIG. 7E, the second dielectric layer 5 has the contact portion X, which contacts the organic semiconductor layer 3 around the first dielectric layer 4, and the mixed layer 6, in which the organic semiconductor layer 3 and the second dielectric layer 5 are mixed with each other, is formed in the interface between the organic semiconductor layer 3 and the second dielectric layer 5 in the contact portion X.

The source electrode and drain electrode formation step is the same as described in the subitem "(4) Different step(s)" in the item "1. First embodiment"; thus, any description thereabout is omitted herein.

Before the organic semiconductor layer formation step, the embodiment may have, as one of the above-mentioned different steps, the source electrode and drain electrode formation step, which is a step of using a substrate and forming the above-mentioned source electrode and drain electrode on the substrate. After the first dielectric layer and second dielectric layer formation step, the embodiment may have, as another of the different steps, a gate electrode formation step of forming a gate electrode on the second dielectric layer. When the embodiment has the source electrode and drain electrode formation step and the gate electrode formation step, an organic semiconductor element of a top-gate/bottom-contact type can be formed.

Figure 8A:
FIGS. 8A to 8F are a process chart illustrating a different example of the method for manufacturing an organic semiconductor element of the second embodiment of the invention.
Figure 8B:
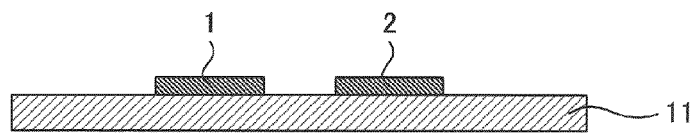
Figure 8C:
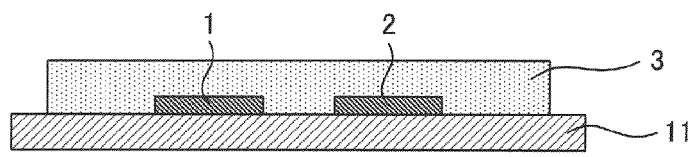
Figure 8D:
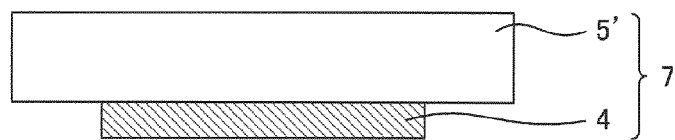
Figure 8E:
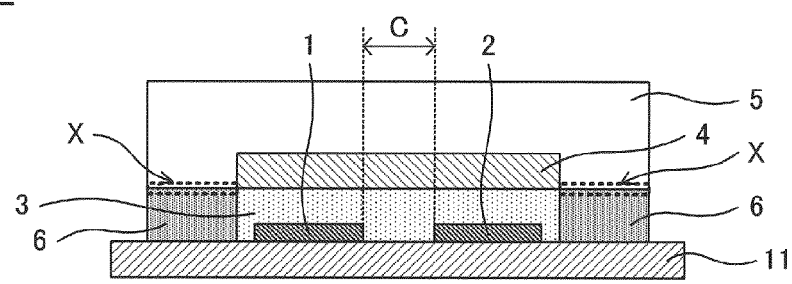
Figure 8F:
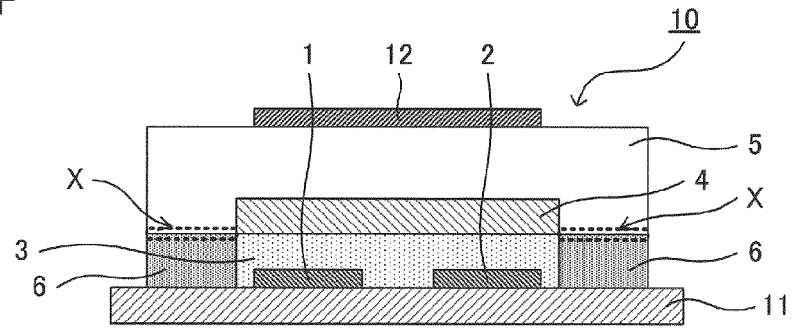

When the method for manufacturing an organic semiconductor element of the embodiment has the source electrode and drain electrode formation step and the gate electrode formation step, for example, the following is performed as illustrated in FIGS. 8A to 8F: s substrate 11 is used (FIG. 8A), and a source electrode 1 and a drain electrode 2 are formed on the substrate 11 (FIG. 8B, source electrode and drain electrode formation step); an organic semiconductor layer 3 is formed to cover the source electrode 1 and the drain electrode 2 (FIG. 8C, organic semiconductor layer formation step); a dielectric layer laminated body 7 is used in which a first dielectric layer 4 is formed on a second-dielectric-layer-forming resin 5' (8D), and the dielectric layer laminated body 7 is bonded under pressure to arrange the first dielectric layer 4 on the organic semiconductor layer 3 to be positioned at least on a channel region C between the source electrode 1 and the drain electrode 2, thereby forming a second dielectric layer 5 on the organic semiconductor layer 3 to cover the first dielectric layer 4 (FIG. 8E, first dielectric layer and second dielectric layer formation step); a gate electrode 12 is then formed on the second dielectric layer 5 (FIG. 8F, gate electrode formation step); and in this way, an organic semiconductor element 10 is formed (FIG. 8F). As illustrated in FIG. 8E, in this process, the second dielectric layer 5 has a contact portion X contacting the organic semiconductor layer 3 around the first dielectric layer 4, and a mixed layer 6 in which the organic semiconductor layer 3 and the second dielectric layer 5 are mixed with each other is formed in an interface between the organic semiconductor layer 3 and the second dielectric layer 5 in the contact portion X. FIGS. 8A to 8F are a process chart illustrating the example, which is a different example of the method for manufacturing an organic semiconductor element of the embodiment.

The source electrode and drain electrode formation step, and the gate electrode formation step are the same as described in the subitem "(4) Different step (s)" in the item "1. First embodiment"; thus, any description thereabout is omitted herein.

Figure 9A:
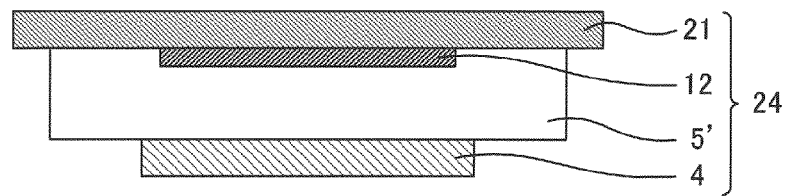
FIGS. 9A and 9B are a process chart illustrating an example of a first dielectric layer and second dielectric layer formation step in the method for manufacturing an organic semiconductor element of the second embodiment of the invention.
Figure 9B:
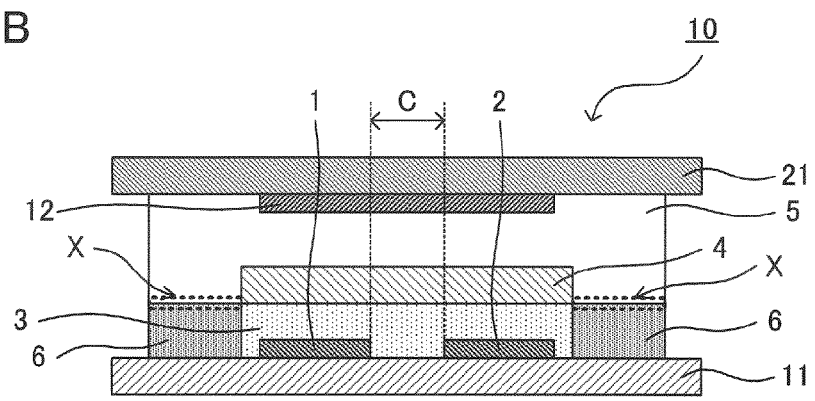
Figure 10A:
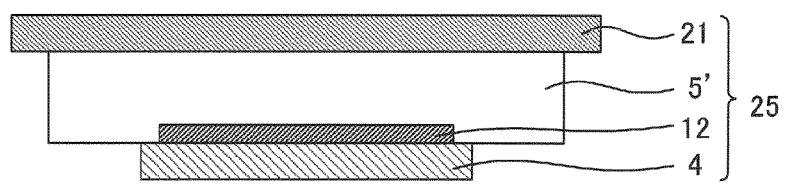
FIGS. 10A and 10B are a process chart illustrating a different example of the first dielectric layer and second dielectric layer formation step in the method for manufacturing an organic semiconductor element of the second embodiment of the invention.
Figure 10B:
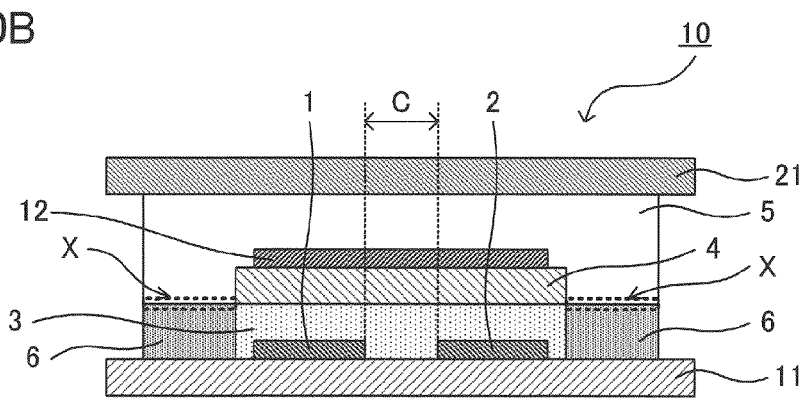

When the method for manufacturing an organic semiconductor element of the embodiment is used to manufacture an organic semiconductor element of a top-gate/bottom-contact type, instead that the method has the above-mentioned gate electrode formation step, the first dielectric layer and second dielectric layer formation step in the embodiment may be a step as illustrated in FIGS. 9A and 9B, in which a laminated body 24 is used which has an arbitrary substrate 21, a gate electrode 12 formed on the substrate 21, a second-dielectric-layer-forming resin 5' laminated on the substrate 21 to cover the gate electrode 12 and a first dielectric layer 4 formed on the second-dielectric-layer-forming resin 5' (FIG. 9A), and this laminated body 24 is bonded under pressure to arrange the first dielectric layer 4 on the organic semiconductor layer 3 to be positioned at least on a channel region C between the source electrode 1 and the drain electrode 2, thereby forming a second dielectric layer 5 on the organic semiconductor layer 3 to cover the first dielectric layer 4 (FIG. 9B), or a step as illustrated in FIGS. 10A and 10B, in which a laminated body 25 is used which has an arbitrary substrate 21, a second-dielectric-layer-forming resin 5' laminated on the substrate 21, a gate electrode 12 formed on the second-dielectric-layer-forming resin 5' and a first dielectric layer 4 formed on the gate electrode 12 (FIG. 10A), and this laminated body 25 is bonded under pressure to arrange the first dielectric layer 4 on the organic semiconductor layer 3 to be positioned at least on a channel region C between the source electrode 1 and the drain electrode 2, thereby forming a second dielectric layer 5 on the organic semiconductor layer 3 to cover the first dielectric layer 4 (FIG. 10B). In this case, after the first dielectric layer and second dielectric layer formation step, the substrate 21 may or may not be peeled off. FIGS. 9A and 9B, as well as FIGS. 10A and 10B, are a process chart illustrating one of the examples referred to herein, which is an example of the first dielectric layer and second dielectric layer formation step in the method for manufacturing an organic semiconductor element of the embodiment. Reference signs not referred to represent the same members as in FIGS. 7A to 7E, respectively; thus, any description thereabout is omitted herein.

B. Organic Semiconductor Element

The following describes the organic semiconductor element of the invention. The organic semiconductor element of the invention comprises: a source electrode and a drain electrode, an organic semiconductor layer formed to cover the source electrode and the drain electrode, a first dielectric layer on the organic semiconductor layer to be positioned at least on a channel region between the source electrode and the drain electrode, and a second dielectric layer formed on the organic semiconductor layer to cover the first dielectric layer, wherein the second dielectric layer has a contact portion contacting the organic semiconductor layer around the first dielectric layer, and a mixed layer in which the organic semiconductor layer and the second dielectric layer are mixed with each other is formed in an interface between the organic semiconductor layer and the second dielectric layer in the contact portion.

Figure 11:
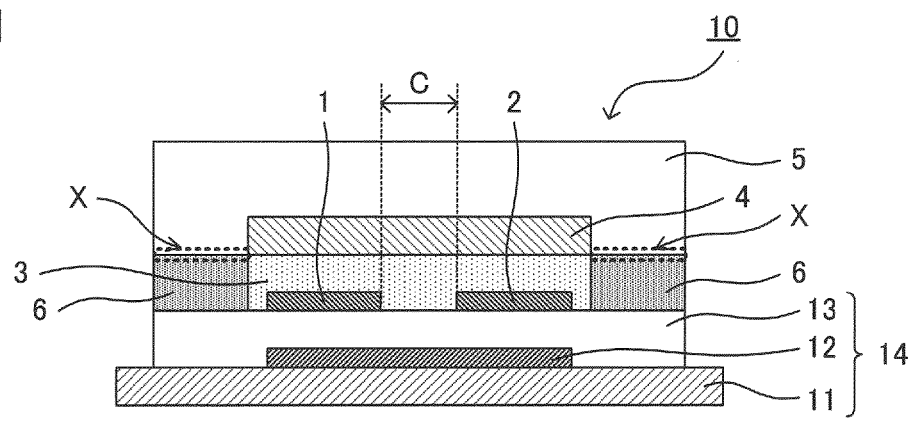
FIG. 11 is a schematic sectional view illustrating an example of the organic semiconductor element of the invention.

With reference to some of the drawings, the organic semiconductor element of the invention is described. FIG. 11 is a schematic sectional view illustrating an example of the organic semiconductor element of the invention. As illustrated in FIG. 11, an organic semiconductor element 10 of the invention comprises: an electrode laminated body 14 having a substrate 11, a gate electrode 12 formed on the substrate 11, and a gate insulating layer 13 formed on the substrate 11 to cover the gate electrode 12; a source electrode 1 and a drain electrode 2 formed on the gate insulating layer 13 of the electrode laminated body 14; an organic semiconductor layer 3 formed to cover the source electrode 1 and the drain electrode 2; a first dielectric layer 4 formed on the organic semiconductor layer 3 to be positioned at least on a channel region C between the source electrode 1 and the drain electrode 2; and a second dielectric layer 5 formed on the organic semiconductor layer 3 to cover the first dielectric layer 4. In the organic semiconductor element 10 of the invention illustrated in FIG. 11, the second dielectric layer 5 has a contact portion X contacting the organic semiconductor layer 3 around the first dielectric layer 4, and a mixed layer 6 in which the organic semiconductor layer 3 and the second dielectric layer are mixed with each other is formed in an interface between the organic semiconductor layer 3 and the second dielectric layer 5 in the contact portion X.

According to the invention, the mixed layer is formed in the interface between the organic semiconductor layer and the second dielectric layer, so that the organic semiconductor layer of the region where the mixed layer is formed is lowered in conductivity while the organic semiconductor layer of the region protected by the first dielectric layer, where the mixed layer is not formed, keeps conductivity. Accordingly, the present organic semiconductor element can be an organic semiconductor element in which its organic semiconductor layer is patterned without lowering the mobility of the organic semiconductor layer.

The organic semiconductor element of the invention comprises at least the source electrode, the drain electrode, the organic semiconductor layer, the first dielectric layer, the second dielectric layer, and the mixed layer. If necessary, the element may have one or more different constituents.

Hereinafter, a description will be made about each of the constituents of the organic semiconductor element of the invention.

1. Organic Semiconductor Layer

First, the organic semiconductor layer in the invention is described. The organic semiconductor layer in the invention is a layer formed to cover a source electrode and a drain electrode. The organic semiconductor layer is usually a layer comprising an organic semiconductor material. The organic semiconductor material used in the invention is the same as described in the section "A. Method for manufacturing an organic semiconductor element"; thus, any description thereabout is omitted herein. The thickness and others of the organic semiconductor layer are also the same as described in the section "A. Method for manufacturing an organic semiconductor element".

2. Second Dielectric Layer

The following describes the second dielectric layer in the invention. The second dielectric layer in the invention is a layer formed on the organic semiconductor layer to cover the first dielectric layer. The second dielectric layer is also a layer having a contact portion contacting the organic semiconductor layer around the first dielectric layer. The material, the thickness, and others, and the contact portion of the second dielectric layer are the same as described in the section "A. Method for manufacturing an organic semiconductor element"; thus, any description thereabout is omitted herein.

3. Mixed Layer

The following describes the mixed layer. The mixed layer in the invention is a layer in which the organic semiconductor layer and the second dielectric layer are mixed with each other in an interface between the organic semiconductor layer and the second dielectric layer in the above-mentioned contact portion. The method for verifying that the mixed layer is formed, and details of the mixed layer are the same as described in the section "A. Method for manufacturing an organic semiconductor element"; thus, any description thereabout is omitted herein.

4. First Dielectric Layer

The following describes the first dielectric layer in the invention. The first dielectric layer in the invention is a layer formed on the organic semiconductor layer to be positioned at least on a channel region between the source electrode and the drain electrode. The material, the thickness, and others of the first dielectric layer are the same as described in the section "A. Method for manufacturing an organic semiconductor element"; thus, any description thereabout is omitted herein.

The first dielectric layer in the invention does not invade the organic semiconductor layer. Herein, the wording "the first dielectric layer does not invade the organic semiconductor layer" means that the mixed layer, in which the organic semiconductor layer and the first dielectric layer are mixed with each other, is not formed to constitute any interface between the organic semiconductor layer and the first dielectric layer. The matter that the mixed layer, in which the organic semiconductor layer and the first dielectric layer are mixed with each other, is not formed to constitute any interface between the organic semiconductor layer and the first dielectric layer can be checked by a method equivalent to the method for checking the mixed layer in which the organic semiconductor layer and the second dielectric layer are mixed with each other.

5. Source Electrode and Drain Electrode

The following describes the source electrode and the drain electrode in the invention. The source electrode and the drain electrode in the invention are electrodes formed to be opposed to each other at a given interval therebetween. The interval set between the source electrode and the drain electrode creates a channel region. The source electrode and the drain electrode are the same as described in the section "A. Method for manufacturing an organic semiconductor element"; thus, any description thereabout is omitted herein.

6. Organic Semiconductor Element

The organic semiconductor element of the invention comprises at least the source electrode, the drain electrode, the organic semiconductor layer, the first dielectric layer, the second dielectric layer and the mixed layer. If necessary, the element may comprise one or more different constituents. The different constituent(s) usable in the invention is/are not particularly limited, and may (each) be a constituent with the desired function selected appropriately in accordance with a use purpose of the organic semiconductor element of the invention, the method for manufacturing the organic semiconductor element of the invention, and other factors. The different constituents usable in the invention are usually a substrate, a gate electrode, and a gate insulating layer. The substrate, the gate electrode, and the gate insulating layer are the same as described in the section "A. Method for manufacturing an organic semiconductor element"; thus, any description thereabout is omitted herein.

In the invention, it is allowable to use an electrode laminated body having a substrate, a gate electrode formed on the substrate, and a gate insulating layer formed on the substrate to cover the gate electrode, wherein the above-mentioned source electrode and drain electrode are formed on the gate insulating layer of the electrode laminated body. When the organic semiconductor element of the invention has this structure, the organic semiconductor element can be rendered an organic semiconductor element of a bottom-gate/bottom-contact type. As has been illustrated in FIG. 11, in the organic semiconductor element 10 of the invention, the source electrode 1 and the drain electrode 2 may be formed on the gate insulating layer 13 of the electrode laminated body 14 having the substrate 11, the gate electrode 12 formed on the substrate 11, and the gate insulating layer 13 formed on the substrate 11 to cover the gate electrode 12.

Figure 12:
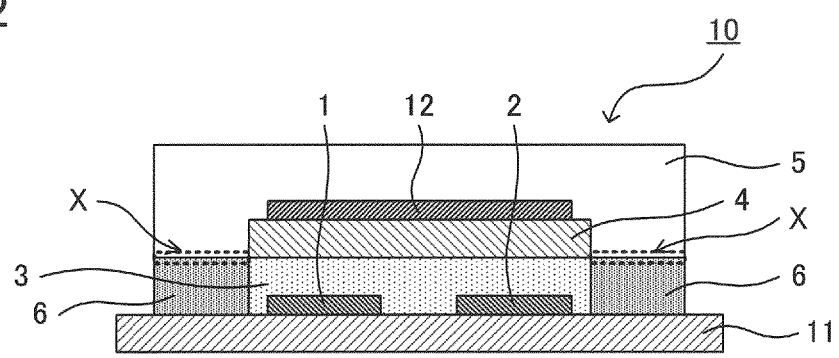
FIG. 12 is a schematic sectional view illustrating a different example of the organic semiconductor element of the invention.
Figure 13:
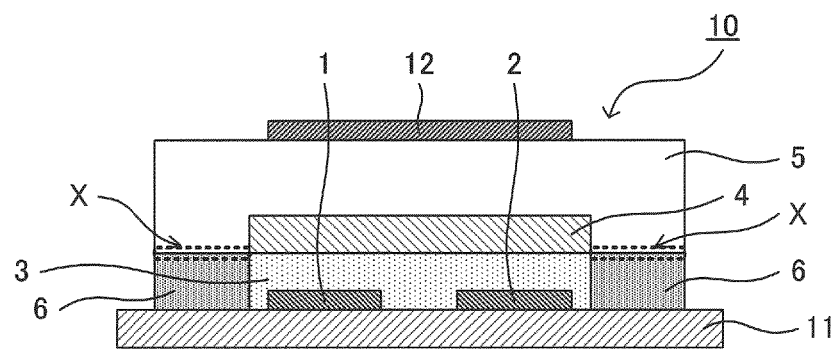
FIG. 13 is a schematic sectional view illustrating a different example of the organic semiconductor element of the invention.

In the invention, it is allowable that the source electrode and the drain electrode are formed on the substrate, and the gate electrode is formed on the first dielectric layer or second dielectric layer. When the organic semiconductor element of the invention has this structure, the element can be rendered an organic semiconductor element of a top-gate/bottom-contact type. As illustrated in FIG. 12, in an organic semiconductor element 10 of the invention, it is allowable that a source electrode 1 and a drain electrode 2 are formed on a substrate 11, and a gate electrode 12 is formed on a first dielectric layer 4. As illustrated in FIG. 13, in an organic semiconductor element 10 of the invention, it is allowable that a source electrode 1 and a drain electrode 2 are formed on a substrate 11, and a gate electrode 12 is formed on a second dielectric layer 5. FIG. 12, as well as FIG. 13, is a schematic sectional view illustrating one of the examples referred to herein, which is a different example of the organic semiconductor element of the invention. Reference signs not referred to represent the same members as in FIG. 11, respectively; thus, any description thereabout is omitted herein.

The organic semiconductor element of the invention may be manufactured by the method described in the section "A. Method for manufacturing an organic semiconductor element".

The invention is not limited to the above-mentioned embodiments. The examples are illustrative examples. Any embodiment that has substantially the same structure and produces the same advantageous effects as any embodiment having the technical conception recited in the claims of the invention is included in the technical scope of the invention.

EXAMPLES

Hereinafter, the invention will be specifically described by way of working examples.

Example 1

(Formation of Electrode Laminated Body)
<Substrate, Gate Electrode and Gate Insulating Layer>
A used substrate was an n-heavy-doped silicon wafer, 0.6 mm in thickness, on which a silicon oxide layer in about 3000 Å (300 nm) thickness was deposited. This was a substrate in which its n-heavy doped silicon region functioned as a gate electrode while the silicon oxide layer functioned as a gate insulating layer. The electrostatic capacity thereof was about 11 $nF/cm^2$ (nanofarad/square centimeter).
(Source Electrode and Drain Electrode Formation Step)
By vacuum deposition, Au was deposited into a thickness of 30 nm through a shadow mask onto the gate insulating layer of the above-mentioned electrode laminated body to have a width (W) of 1000 μm and a length (L) of 50 nm. In this way, a source electrode and a drain electrode were formed.
(Organic Semiconductor Layer Formation Step)
An organic-semiconductor-layer-forming coating liquid was prepared in which 6,13-bis(triisopropylsilylethynyl)pentacene (TIPS pentacene), which is an organic semiconductor material, was dissolved in xylene into a concentration of 1% by weight. The coating liquid was coated into a thickness of 40 nm onto the gate insulating layer by spin coating (at 1000 rpm for 30 seconds) to cover the source electrode and the drain electrode. The resultant workpiece was dried at 100° C. for 1 minute to form an organic semiconductor layer.
(First Dielectric Layer Formation Step)
A first-dielectric-layer-forming coating liquid was prepared in which Teflon AF™ (manufactured by Du Pont-Mitsui Fluorochemicals Co., Ltd.) was dissolved in FLUORINERT FC-40™ (manufactured by Sumitomo 3M Ltd.) into a concentration of 6% by weight. The coating liquid was coated onto the organic semiconductor layer by screen printing to be positioned at least on a channel region between the source electrode and the drain electrode. The resultant workpiece was dried at 100° C. for 20 minutes to form a first dielectric layer 1 μm in thickness.
(Second Dielectric Layer Formation Step)
A second-dielectric-layer-forming coating liquid was prepared in which polymethyl methacrylate (PMMA) was dissolved in PEGMEA into a concentration of 5% by weight. The coating liquid was coated onto the organic semiconductor layer by spin coating to cover the first dielectric layer. The resultant workpiece was dried at 100° C. for 10 minutes to form a second dielectric layer 0.5 μm in thickness. In this way, organic semiconductor elements were each manufactured.

Comparative Example 1

Organic semiconductor elements were each manufactured in the same way as in Example 1 except that the second dielectric layer formation step was not performed.

Example 2

Organic semiconductor elements were each manufactured in the same way as in Example 1 except that a first dielectric layer and second dielectric layer formation step described below was performed instead of the above-mentioned first dielectric layer formation step and second dielectric layer formation step.
(First Dielectric Layer and Second Dielectric Layer Formation Step)
A first-dielectric-layer-forming coating liquid was prepared in which Teflon AF™ (manufactured by Du Pont-Mitsui Fluorochemicals Co., Ltd.) was dissolved in FLUORINERT FC40™ (manufactured by Sumitomo 3M Ltd.) into a concentration of 6% by weight. The coating liquid was coated onto a pouch film (manufactured by Meikoshokai Co., Ltd.), 100 μm in thickness, which was a second-dielectric-layer-forming resin, by screen printing. The resultant workpiece was dried at 100° C. for 10 minutes to form a first dielectric layer 1 μm in thickness. In this way, a dielectric layer laminated body was formed. This dielectric layer laminated body was used, and the body was bonded as described above under pressure and heat at 100° C. by means of a laminator (GLM350R6™, manufactured by Japan GBC K.K.) to arrange the first dielectric layer on the organic semiconductor layer to be positioned at least on the channel region between the source electrode and the drain electrode. In this way, a second dielectric layer was formed on the organic semiconductor layer to cover the first dielectric layer. In this way, organic semiconductor elements were each manufactured.

Comparative Example 2

Organic semiconductor elements were each manufactured in the same way as in Example 2 except that the first dielectric layer and second dielectric layer formation step was not performed.

Example 3

Organic semiconductor elements were each manufactured in the same way as in Example 1 except that a second dielectric layer formation step described below was performed instead of the above-mentioned second dielectric layer formation step.
(Second Dielectric Layer Formation Step)
A pouch film (manufactured by Meikoshokai Co., Ltd.), 100 μm in thickness, which was a second-dielectric-layer-forming resin, was bonded onto the same organic semiconductor layer as described above under pressure and heat at 100° C. by means of a laminator (GLM350R6™, manufactured by Japan GBC K.K.) to cover the first dielectric layer. In this way, a second dielectric layer was formed to manufacture each of the organic semiconductor elements.

Comparative Example 3

Organic semiconductor elements were each manufactured in the same way as in Example 3 except that the second dielectric layer formation step was not performed.

1 described below is the average value of the mobilities of the respective organic semiconductor layers obtained from 5 or more of the transistors (of each of these examples). About conditions for the measurement, the gate voltage $V_G$ was applied in the range of +30 to −50 V and the source/drain voltage $V_{SD}$ was applied to give −50 V in the atmosphere. In each of FIGS. 14 to 19, FEM represents the (average) mobility of the organic semiconductor layers.

TABLE 1

|  | $V_{SD}$(V) | $V_T$(V) | MOBILITY ($cm^2$/Vs) | ON CURRENT (A) | OFF CURRENT (A) |
| --- | --- | --- | --- | --- | --- |
| EXAMPLE 1 | −50 | 7.73 | 0.055 | $1.38 \times 10^{-5}$ | $4.84 \times 10^{-13}$ |
| COMPARATIVE EXAMPLE 1 | −50 | 8.30 | 0.053 | $1.40 \times 10^{-5}$ | $3.45 \times 10^{-9}$ |
| EXAMPLE 2 | −50 | −1.18 | 0.048 | $8.14 \times 10^{-6}$ | $2.36 \times 10^{-12}$ |
| COMPARATIVE EXAMPLE 2 | −50 | −2.30 | 0.037 | $7.07 \times 10^{-6}$ | $6.79 \times 10^{-10}$ |
| EXAMPLE 3 | −50 | 8.22 | 0.037 | $8.99 \times 10^{-6}$ | $1.05 \times 10^{-11}$ |
| COMPARATIVE EXAMPLE 3 | −50 | 7.81 | 0.037 | $8.22 \times 10^{-6}$ | $2.74 \times 10^{-9}$ |

[Evaluation]
(Observation of the Organic Semiconductor Elements)

The organic semiconductor elements manufactured in the above-mentioned working examples and comparative examples were measured, using an angle resolved microdomain X-ray photoelectron spectrometer (Theta Probe™, manufactured by Thermofisher Scientific Inc.). About Example 1, the measurement was made from the upper surface of any one of the organic semiconductor elements. About each of Examples 2 and 3, after the pouch film of any one of the elements was peeled off, the measurement was made from the upper surface. As a result, in Examples 1 to 3, in their region where their first dielectric layer was not formed, peaks originating from their organic semiconductor layer and their second dielectric layer were observed. Thus, it was verified that in the region where the first dielectric layer was not formed, a mixed layer composed of the organic semiconductor layer and the second dielectric layer was formed.

(Transistor Property Evaluation)

About the organic semiconductor elements manufactured in the working examples and the comparative examples, transistor properties thereof were evaluated. The evaluation of the transistor properties was made, using a device, 237 HIGH VOLTAGE SOURCE MEASUREMENT UNIT™, manufactured by Keithley Instruments Inc. The carrier mobility (μ) (of each of the elements) was calculated in accordance with an equation described below, using data in their saturated region (gate voltage $V_G$<source/drain voltage $V_{SD}$). In the equation, $I_D$ represents the drain current in the saturated region; W and L, the width and the length of the semiconductor channel, respectively; Ci, the electrostatic capacity per unit area of the gate electrode; and $V_G$ and $V_T$, the gate voltage and the threshold voltage, respectively. The $V_T$ of this device was calculated from a relationship between the square root of the $I_D$ in the saturated region and the $V_G$ of the device that was gained by extrapolating $I_D$=0 from measured data.

$$I_D = Ci\mu(W/2L)(V_G - V_T)^2$$

Figure 14:
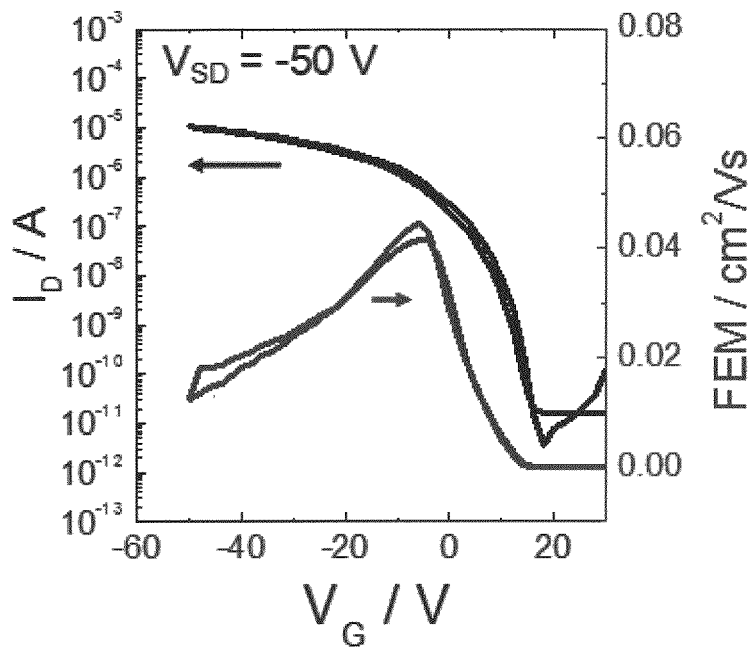
FIG. 14 is a graph showing results of the evaluation of transistor properties of organic semiconductor elements manufactured in Example 1.
Figure 15:
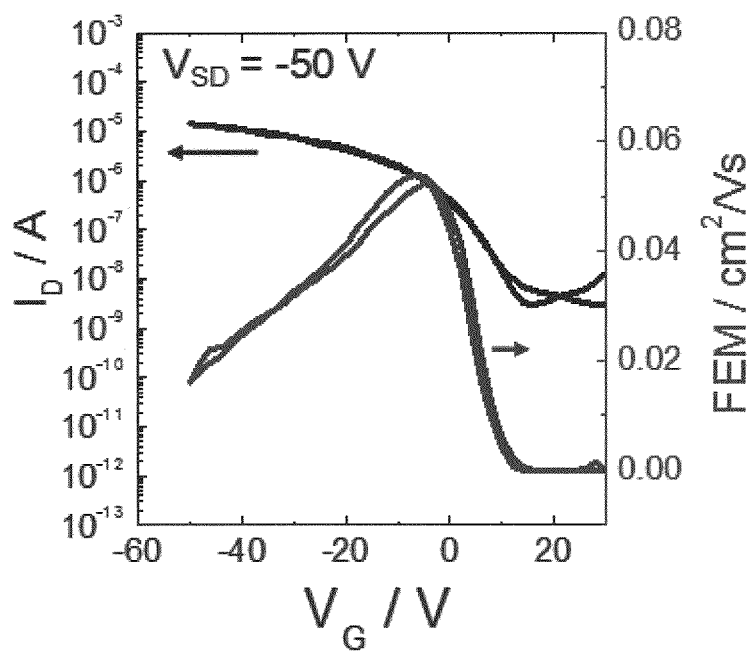
FIG. 15 is a graph showing results of the evaluation of transistor properties of organic semiconductor elements manufactured in Comparative Example 1.
Figure 16:
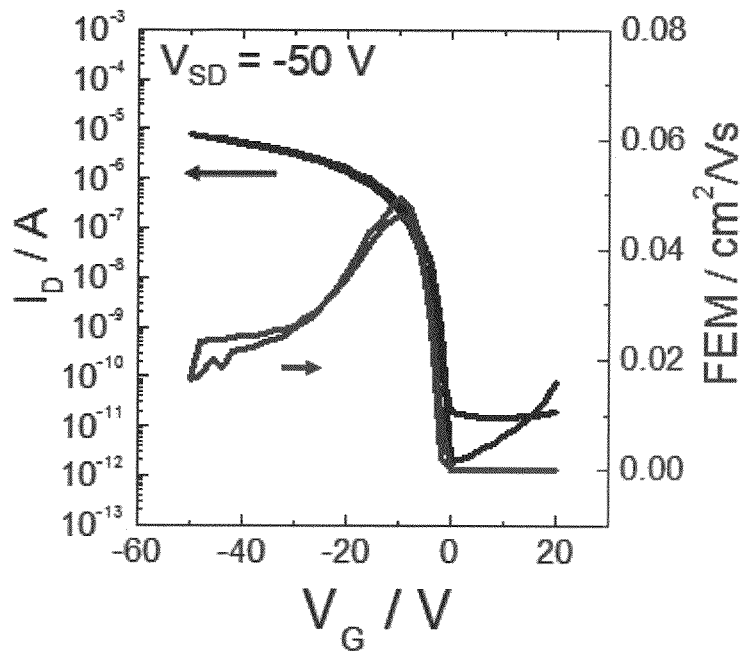
FIG. 16 is a graph showing results of the evaluation of transistor properties of organic semiconductor elements manufactured in Example 2.
Figure 17:
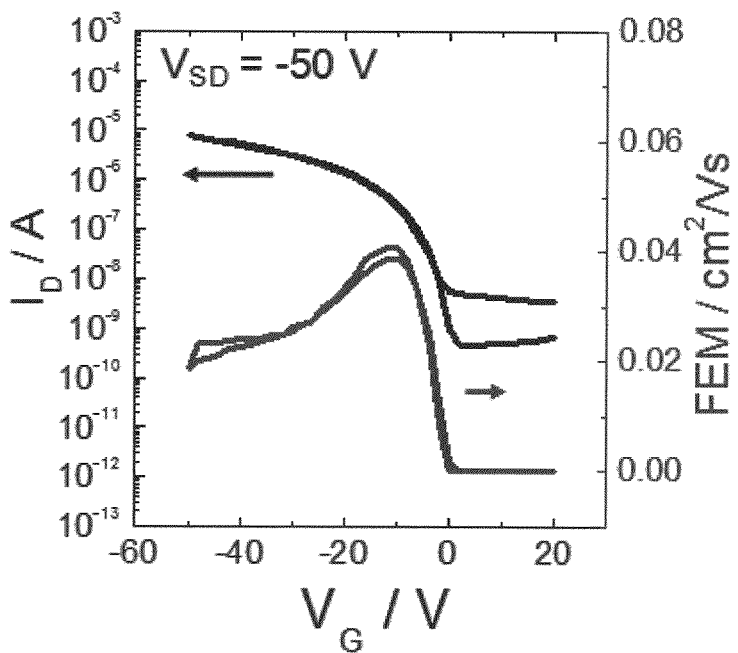
FIG. 17 is a graph showing results of the evaluation of transistor properties of organic semiconductor elements manufactured in Comparative Example 2.
Figure 18:
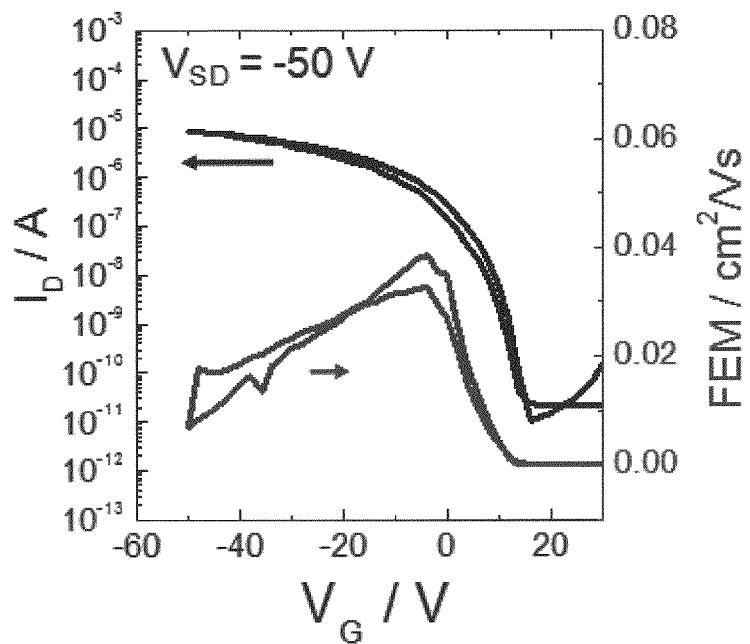
FIG. 18 is a graph showing results of the evaluation of transistor properties of organic semiconductor elements manufactured in Example 3.
Figure 19:
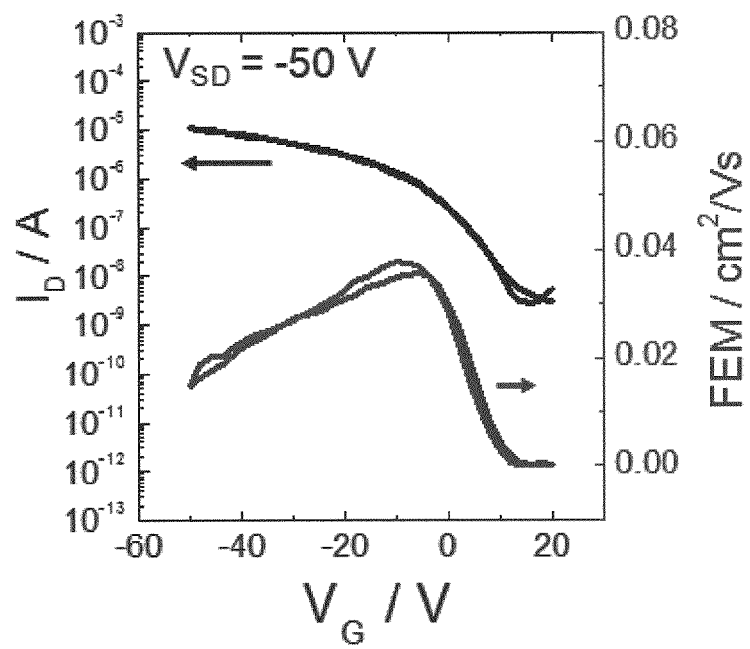
FIG. 19 is a graph showing results of the evaluation of transistor properties of organic semiconductor elements manufactured in Comparative Example 3.

Results of the evaluation are shown in Table 1 described below. Results of the transistor property evaluation of the organic semiconductor elements manufactured in Example 1, Comparative Example 1, Example 2, Comparative Example 2, Example 3 and Comparative Example 3 are shown in FIGS. 14 to 19, respectively. Each of the mobilities shown in Table As shown in FIGS. 14 and 15 and Table 1, it was verified that in Example 1 the mobility of the organic semiconductor layers was equivalent to that in Comparative Example 1 and the OFF current value was largely lowered. According to FIGS. 16 and 17 and Table 1, it was verified that in Example 2, similarly, the mobility of the organic semiconductor layers was made better than that in Comparative Example 2 and further the OFF current value was lowered. Furthermore, according to FIGS. 18 and 19 and Table 1, it was verified that in Example 3, similarly, the mobility of the organic semiconductor layers was not varied from that in Comparative Example 3 and the OFF current value was lowered. From these results, it can be considered that in the method of the invention for manufacturing an organic semiconductor element, through a simple and easy process, its organic semiconductor layer can be patterned without lowering the mobility of the organic semiconductor layer at the same time when its second dielectric layer corresponding to a conventional passivation layer is formed.

REFERENCE SIGNS LIST

1 . . . source electrode
2 . . . drain electrode
3 . . . organic semiconductor layer
4 . . . first dielectric layer
5 . . . second dielectric layer
5' . . . second-dielectric-layer-forming resin
6 . . . mixed layer
7 . . . dielectric layer laminated body
10 . . . organic semiconductor element
11 . . . substrate
12 . . . gate electrode
13 . . . gate insulating layer
14 . . . electrode laminated body
C . . . channel region
X . . . contact portion

The invention claimed is:
1. A method for manufacturing an organic semiconductor element, comprising steps of:
an organic semiconductor layer formation step of forming an organic semiconductor layer to cover a source electrode and a drain electrode;

a first dielectric layer formation step of forming a first dielectric layer on the organic semiconductor layer to be positioned at least on a channel region between the source electrode and the drain electrode; and a second dielectric layer formation step of forming a second dielectric layer on the organic semiconductor layer to cover the first dielectric layer, wherein the second dielectric layer has a contact portion contacting the organic semiconductor layer around the first dielectric layer, and a mixed layer in which the organic semiconductor layer and the second dielectric layer are mixed with each other is formed in an interface between the organic semiconductor layer and the second dielectric layer in the contact portion.

2. The method for manufacturing an organic semiconductor element according to claim 1, wherein in the second dielectric layer formation step, a second-dielectric-layer-forming coating liquid is coated to form the second dielectric layer.

3. The method for manufacturing an organic semiconductor element according to claim 1, wherein in the second dielectric layer formation step, a second-dielectric-layer-forming resin is bonded under pressure to form the second dielectric layer.

4. The method for manufacturing an organic semiconductor element according to claim 1, comprising, before the organic semiconductor layer formation step, a source electrode and drain electrode formation step of using an electrode laminated body having a substrate, a gate electrode formed on the substrate, and a gate insulating layer formed on the substrate to cover the gate electrode, and forming the source electrode and the drain electrode on the gate insulating layer of the electrode laminated body.

5. A method for manufacturing an organic semiconductor element, comprising steps of:

an organic semiconductor layer formation step of forming an organic semiconductor layer to cover a source electrode and a drain electrode; and a first dielectric layer and second dielectric layer formation step of using a dielectric layer laminated body in which a first dielectric layer is formed on a second-dielectric-layer-forming resin, and bonding the dielectric layer laminated body under pressure to arrange the first dielectric layer on the organic semiconductor layer to be positioned at least on a channel region between the source electrode and the drain electrode, thereby forming a second dielectric layer on the organic semiconductor layer to cover the first dielectric layer, wherein the second dielectric layer has a contact portion contacting the organic semiconductor layer around the first dielectric layer, and a mixed layer in which the organic semiconductor layer and the second dielectric layer are mixed with each other is formed in an interface between the organic semiconductor layer and the second dielectric layer in the contact portion.

6. The method for manufacturing an organic semiconductor element according to claim 5, comprising, before the organic semiconductor layer formation step, a source electrode and drain electrode formation step of using an electrode laminated body having a substrate, a gate electrode formed on the substrate, and a gate insulating layer formed on the substrate to cover the gate electrode, and forming the source electrode and the drain electrode on the gate insulating layer of the electrode laminated body.

7. An organic semiconductor element comprising:

a source electrode and a drain electrode;

an organic semiconductor layer formed to cover the source electrode and the drain electrode;

a first dielectric layer formed on the organic semiconductor layer to be positioned at least on a channel region between the source electrode and the drain electrode; and a second dielectric layer formed on the organic semiconductor layer to cover the first dielectric layer, wherein the second dielectric layer has a contact portion contacting the organic semiconductor layer around the first dielectric layer, and a mixed layer in which the organic semiconductor layer and the second dielectric layer are mixed with each other is formed in an interface between the organic semiconductor layer and the second dielectric layer in the contact portion.

8. The organic semiconductor element according to claim 7, comprising an electrode laminated body having a substrate, a gate electrode formed on the substrate, and a gate insulating layer formed on the substrate to cover the gate electrode, and wherein the source electrode and the drain electrode are formed on the gate insulating layer of the electrode laminated body.

* * * * *